(12) United States Patent
Okita et al.

(10) Patent No.: US 9,911,638 B2
(45) Date of Patent: Mar. 6, 2018

(54) PLASMA PROCESSING APPARATUS AND PLASMA PROCESSING METHOD

(71) Applicant: Panasonic Intellectual Property Management Co., Ltd., Osaka (JP)

(72) Inventors: Shogo Okita, Hyogo (JP); Atsushi Harikai, Osaka (JP); Noriyuki Matsubara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/015,934

(22) Filed: Feb. 4, 2016

(65) Prior Publication Data
US 2016/0293469 A1    Oct. 6, 2016

(30) Foreign Application Priority Data

Mar. 31, 2015  (JP) ................ 2015-073704
Mar. 31, 2015  (JP) ................ 2015-074037

(51) Int. Cl.
| | |
|---|---|
| *H01L 21/683* | (2006.01) |
| *H01L 21/3065* | (2006.01) |
| *H01L 21/78* | (2006.01) |
| *H01J 37/32* | (2006.01) |
| *H01L 21/687* | (2006.01) |

(52) U.S. Cl.
CPC .... *H01L 21/6831* (2013.01); *H01J 37/32568* (2013.01); *H01J 37/32697* (2013.01); *H01J 37/32715* (2013.01); *H01L 21/3065* (2013.01); *H01L 21/6833* (2013.01); *H01L 21/6836* (2013.01); *H01L 21/68742* (2013.01); *H01L 21/78* (2013.01); *H01L 2221/68327* (2013.01)

(58) Field of Classification Search
None
See application file for complete search history.

(56) References Cited

U.S. PATENT DOCUMENTS

| | | | |
|---|---|---|---|
| 2002/0002950 A1* | 1/2002 | Tsuchihashi | ........ C23C 16/4586 118/724 |
| 2010/0216313 A1 | 8/2010 | Iwai | |

(Continued)

FOREIGN PATENT DOCUMENTS

JP          2009-094436 A     4/2009

*Primary Examiner* — Jiong-Ping Lu
(74) *Attorney, Agent, or Firm* — Pearne & Gordon LLP

(57) ABSTRACT

A plasma processing apparatus includes: a reaction chamber; a plasma generation unit; a stage disposed inside the reaction chamber; an electrostatic chuck mechanism including an electrode portion disposed inside the stage; a support portion which supports the conveyance carrier; and an elevation mechanism which elevates and lowers the support portion relative to the stage. In a case in which the conveyance carrier is mounted on the stage, the electrostatic chuck mechanism performs an operation of applying a voltage to the electrode portion after contact of an outer circumferential portion of a holding sheet of the conveyance carrier to the stage, the operation including a voltage varying operation of increasing and decreasing an absolute value of the voltage, and the plasma generation unit generates plasma after completion of the voltage varying operation.

13 Claims, 15 Drawing Sheets

(56) References Cited

U.S. PATENT DOCUMENTS

2012/0238073 A1* 9/2012 Johnson .............. H01L 21/3065
438/464
2012/0248066 A1* 10/2012 Yamazawa ............ H01J 37/321
216/68

* cited by examiner

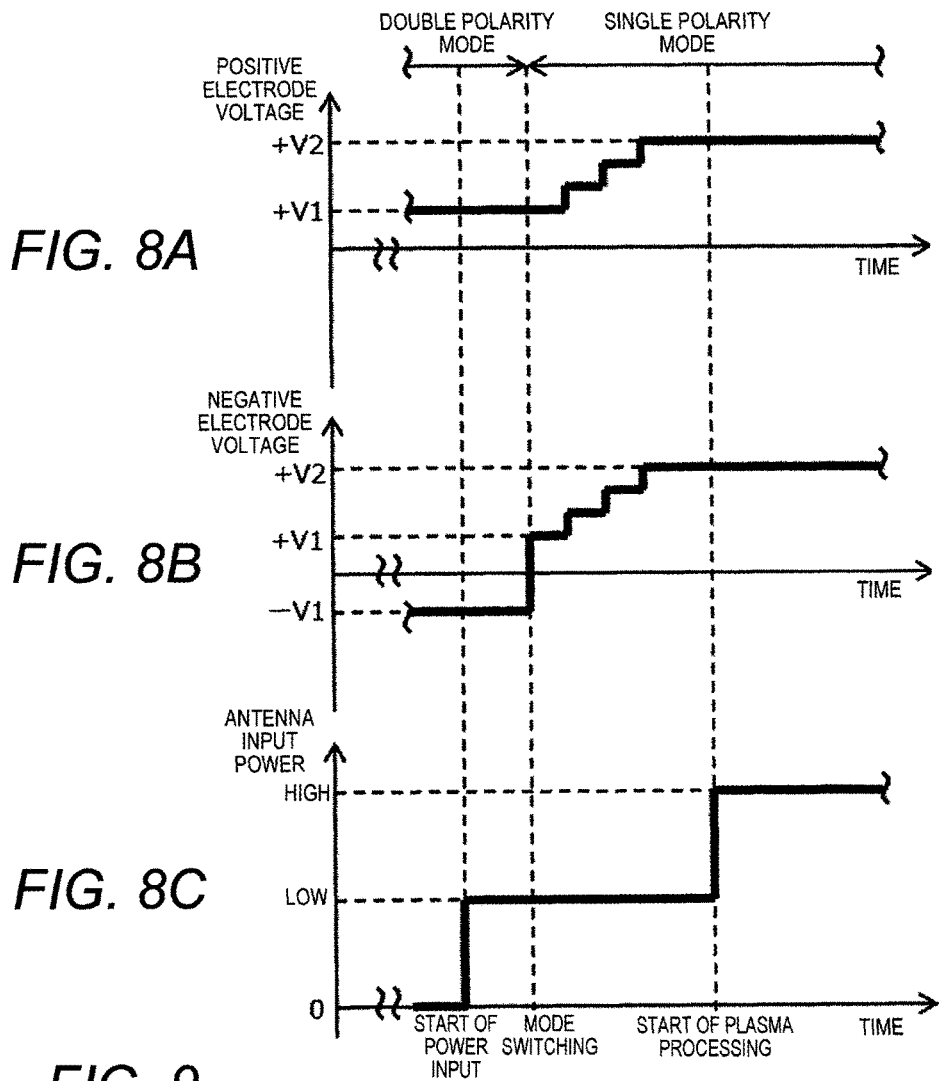
FIG. 8A
FIG. 8B
FIG. 8C
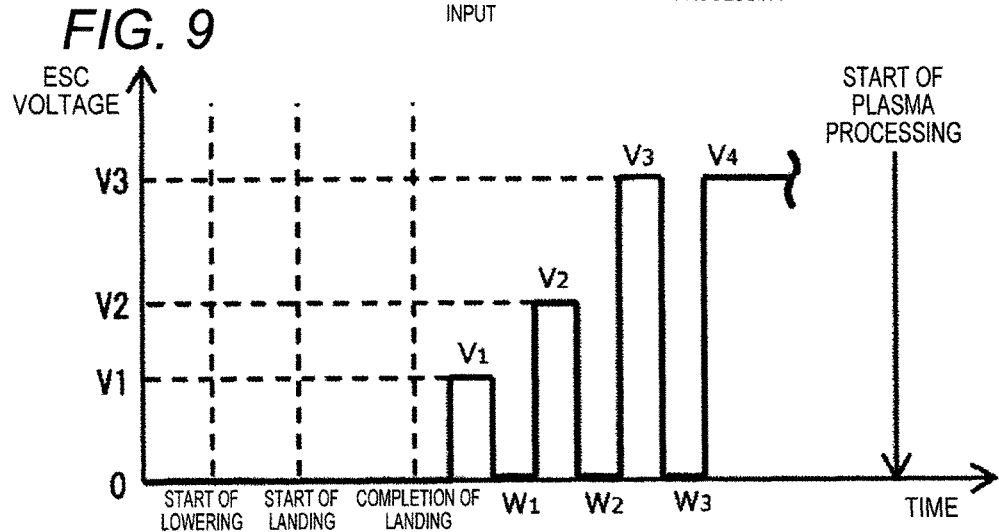
FIG. 9

PLASMA PROCESSING APPARATUS AND PLASMA PROCESSING METHOD

CROSS-REFERENCE TO RELATED APPLICATION(S)

This application is based on and claims priority from Japanese Patent Application No. 2015-073704 filed on Mar. 31, 2015 and Japanese Patent Application No. 2015-074037 filed on Mar. 31, 2015, the entire contents of which are incorporated herein by reference.

BACKGROUND

1. Field of the Invention

One or more embodiments of the present invention relate to a plasma processing apparatus and a plasma processing method. More particularly, one or more embodiments of the invention relate to a plasma processing apparatus and a plasma processing method for processing a substrate that is held by a conveyance carrier.

2. Description of Related Art

Among various methods for dicing a substrate is plasma dicing which performs plasma etching on a substrate on which a resist mask is formed and thereby divides it into individual chips. JP-A-2009-94436 discloses performing plasma processing on a substrate that is mounted on a plasma processing stage (hereinafter referred to simply as a stage) in such a manner as to be bonded to a conveyance carrier having a frame and a holding sheet that covers an opening of the frame, to improve substrate handling performance during conveyance etc.

SUMMARY

Where plasma processing is performed on a substrate that is mounted being held by a conveyance carrier, usually the conveyance carrier is absorbed on the stage by means of an electrostatic chuck mechanism called an electrostatic chuck. The electrostatic chuck mechanism applies a voltage to an electrostatic chuck electrode (hereinafter referred to as an ESC electrode) disposed inside the stage and causes the conveyance carrier to be absorbed on the stage by Coulomb force or Johnsen-Rahbek force that acts between the ESC electrode and the conveyance carrier. The stage is being cooled. By performing plasma processing in a state that the conveyance carrier is absorbed on the stage being cooled, the conveyance carrier being subjected to plasma processing can be cooled effectively.

In recent years, with the miniaturization and thickness reduction of electronic devices, IC chips etc. that are incorporated in electronic devices have been reduced in thickness. And substrates on which IC chips etc. as dicing targets are to be formed have been reduced in thickness accordingly and hence are prone to warp.

Holding sheets for holding a substrate are also thin and hence prone to warp. Therefore, there may occur an event that a conveyance carrier that holds a substrate is mounted on a stage with the holding sheet wrinkled. The holding sheet is not unwrinkled even if the conveyance carrier is absorbed on the stage by means of an electrostatic chuck mechanism. If plasma processing is performed in a state that the holding sheet is kept wrinkled, abnormal discharge or temperature increase may occur at wrinkles to disable normal plasma processing.

A plasma processing apparatus for performing plasma processing on a substrate that is held by a conveyance carrier including a holding sheet that holds the substrate and a frame that is attached to an outer circumferential portion of the holding sheet, said plasma processing apparatus including: a reaction chamber; a plasma generation unit which generates plasma in the reaction chamber; a stage which is disposed inside the reaction chamber and on which the conveyance carrier is mountable; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage, wherein in a case in which the conveyance carrier is mounted on the stage, the electrostatic chuck mechanism performs an operation of applying a voltage to the electrode portion after contact of the outer circumferential portion of the holding sheet to the stage, the operation including a voltage varying operation of increasing and decreasing an absolute value of the voltage, and the plasma generation unit generates plasma after completion of the voltage varying operation.

A plasma processing method for performing plasma processing on a substrate that is held by a conveyance carrier that is mounted on a stage of the plasma processing apparatus, the conveyance carrier including a holding sheet that holds the substrate and a frame that is attached to an outer circumferential portion of the holding sheet, said plasma processing method including: causing a support portion, which is capable of being elevated and lowered relative to the stage, to support the conveyance carrier at a transfer position that is distant from the stage upward; mounting the conveyance carrier to a stage-mounted position on the stage by lowering the support portion; and performing an operation of applying a voltage to an electrode portion, disposed inside the stage, of an electrostatic chuck mechanism, wherein the operation includes a voltage varying operation of increasing and decreasing an absolute value of the voltage after contact of the outer circumferential portion of the holding sheet to the stage, and wherein the plasma processing is performed after completion of the voltage varying operation.

A plasma processing apparatus for performing plasma processing on a substrate that is held by a conveyance carrier including a holding sheet that holds the substrate and a frame that is attached to an outer circumferential portion of the holding sheet, said plasma processing apparatus including: a reaction chamber; a plasma generation unit which generates plasma in the reaction chamber; a stage which is disposed inside the reaction chamber and on which the conveyance carrier is to be mounted; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage, wherein in a case in which the conveyance carrier is mounted on the stage, the elevation mechanism performs an elevation/lowering operation of elevating and lowering the support portion in at least one cycle near the stage after contact of the holding sheet to the stage, and the plasma generation unit generates plasma after completion of the elevation/lowering operation and also after contact of the outer circumferential portion of the holding sheet to the stage.

A plasma processing apparatus for performing plasma processing on a substrate that is held by a conveyance carrier including a holding sheet that holds the substrate and a frame that is attached to an outer circumferential portion of the holding sheet, said plasma processing apparatus including: a reaction chamber; a plasma generation unit which generates plasma in the reaction chamber; a stage which is disposed inside the reaction chamber and on which the conveyance carrier is to be mounted; an electrostatic chuck mechanism including an electrode portion that is disposed inside the stage; a support portion which supports the conveyance carrier between a stage-mounted position on the stage and a transfer position that is distant from the stage upward; and an elevation mechanism which elevates and lowers the support portion relative to the stage, wherein in a case in which the conveyance carrier is mounted on the stage, the elevation mechanism performs an elevation/lowering operation of elevating and lowering the support portion in at least one cycle near the stage after contact of the holding sheet to the stage, and the plasma generation unit generates plasma after completion of the elevation/lowering operation and also after contact of the outer circumferential portion of the holding sheet to the stage.

Owing to one or more embodiments of the invention, it is possible to increase the yield of products of plasma processing that is performed on a substrate that is held by a conveyance carrier.

BRIEF DESCRIPTION OF THE DRAWINGS

FIGS. 8A to 8C show an operation of the plasma processing apparatus according to the first embodiment; FIGS. 8A and 8B are conceptual graphs in which the horizontal axis represents the time from a start of input of power to an antenna from a first radio-frequency power source and the vertical axis represents the voltage(s) that is applied to the ESC electrode(s), and FIG. 8C is a conceptual graph in which the horizontal axis is the same as that of each of FIGS. 8A and 8B and the vertical axis represents the power that is input to the antenna.

FIG. 9 is a conceptual graph showing an operation of a plasma processing apparatus according to a second embodiment of the invention in which the horizontal axis represents the time a start of lowering of the support portion and the vertical axis represents the voltage(s) applied to the ESC electrode(s).

FIG. 11A is a conceptual graph in which the horizontal axis represents the time from a start of lowering of the support portion and the vertical axis represents the voltage(s) applied to the ESC electrode(s), and FIG. 11B is a conceptual graph in which the horizontal axis is the same as that of FIG. 11A and the vertical axis represents the distance T between the top surface of the support portion and the stage.

FIG. 14A is a conceptual graph in which the horizontal axis represents the time from a start of lowering of the support portion and the vertical axis represents the voltage(s) applied to the ESC electrode(s), and FIG. 14B is a conceptual graph in which the horizontal axis is the same as that of FIG. 14A and the vertical axis represents the distance T between the top surface of the support portion and the stage.

FIG. 15A is a conceptual graph in which the horizontal axis represents the time from a start of lowering of the support portion and the vertical axis represents the voltage(s) applied to the ESC electrode(s), and FIG. 15B is a conceptual graph in which the horizontal axis is the same as that of FIG. 15A and the vertical axis represents the distance T between the top surface of the support portion and the stage.

DETAILED DESCRIPTION

Figure 1A:
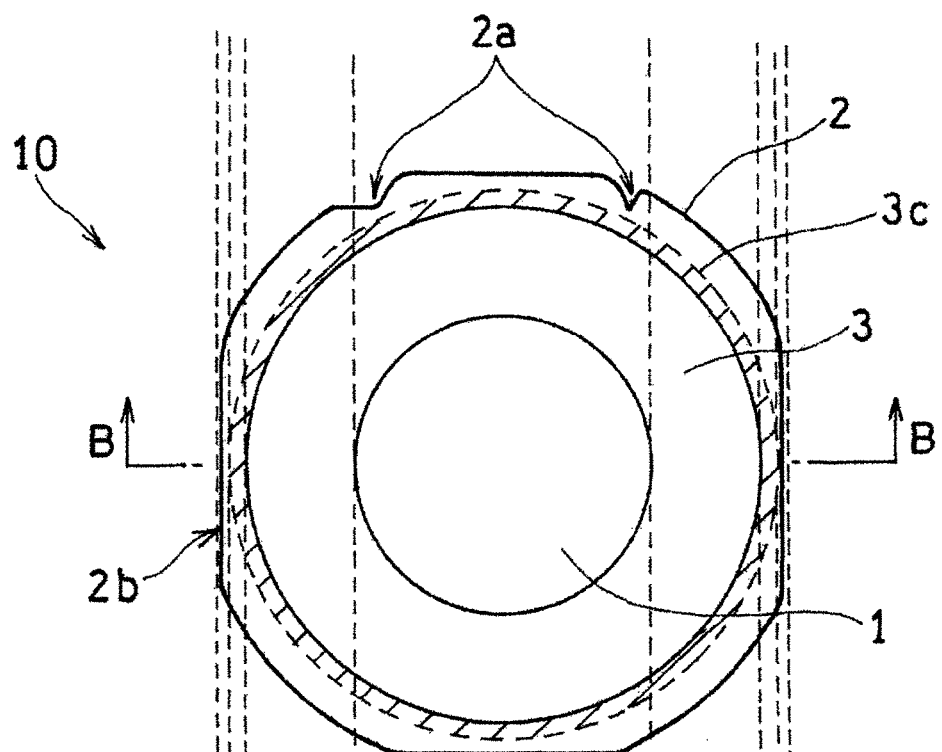
FIG. 1A is a schematic top view of a conveyance carrier used in embodiments of the present invention which holds a substrate.
Figure 1B:
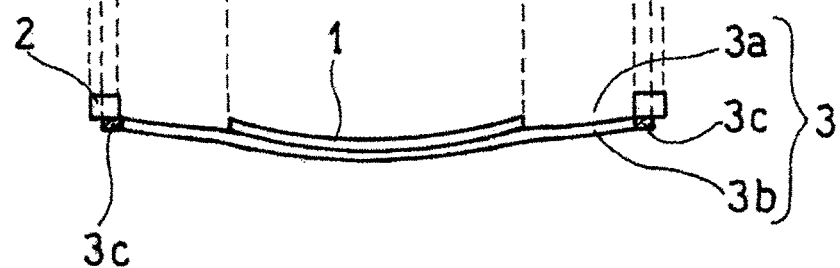
FIG. 1B is a sectional view taken along line B-B in FIG. 1A.

Embodiments of the present invention will be hereinafter described in detail with reference to the drawings. FIG. 1A is a schematic top view of a conveyance carrier 10 used in the embodiments, and FIG. 1B is a sectional view, taken along line B-B in FIG. 1A, of the conveyance carrier 10 in a no load state. Although a frame 2 and a substrate 1 are circular in FIGS. 1A and 1B, the invention is not limited to such a case.

As shown in FIG. 1A, the conveyance carrier 10 is equipped with the frame 2 and a holding sheet 3 that holds the substrate 1. An outer circumferential portion 3c of the holding sheet 3 is fixed to the frame 2. The substrate 1 is bonded to the holding sheet 3 and thereby held by the conveyance carrier 10. The outer circumferential portion 3*c* occupies an overlap region between the holding sheet 3 and the frame 2. In FIGS. 1A and 1B, the outer circumferential portion 3*c* is hatched just for the sake of convenience.

The substrate 1 is a processing object of plasma processing such as plasma dicing. The substrate 1 is produced by forming a circuit layer of semiconductor circuits, electronic components, MEMS devices, etc. on one surface of a substrate body (made of Si, GaAs, SiC, or the like) and decreasing its thickness by grinding the back side, opposite to the circuit layer, of the substrate body. Usually, the substrate 1 is as very thin as about 25 to 150 µm and hence has almost no self-supportiveness (rigidity) in itself. As the substrate 1 becomes thinner, it becomes more prone to warp or bend due to an internal stress difference between the circuit layer and the substrate body. When the substrate 1 warps or bends, it becomes difficult to, for example, convey or cool the substrate 1 in performing plasma processing on it.

In view of the above, the outer circumferential portion 3*c* of the holding sheet 3 is fixed to the frame 2 which is approximately flat in such a state that the holding sheet 3 is under tension and the substrate 1 is bonded to the holding sheet 3. The holding sheet 3 is a resin sheet of about 50 to 150 µm in thickness and is rigid enough to be able to hold the substrate 1. One surface of the holding sheet 3 is formed with an adhesive layer and the substrate 1 is bonded to the adhesive layer. In this manner, in the conveyance carrier 10, the substrate 1, the holding sheet 3, and the frame 2 can be set approximately in the same plane. This facilitates handling of the substrate 1 such as its conveyance and its cooling during the plasma processing in performing plasma processing on it.

However, where the substrate 1 is bonded to the holding sheet 3 whose outer circumferential portion 3*c* is fixed to the frame 2, the holding sheet 3 may warp as shown in FIG. 1B. In FIG. 1B, the warp is exaggerated to facilitate understanding.

Four possible causes of a warp of the holding sheet 3 will be described below.

The first cause is of a case that the holding sheet 3 warps due to distortion of the frame 2. Although the frame 2 is designed so as to be flat, it may be rendered low in flatness due to variations in manufacture, allowances of manufacture, repeated use in manufacture, and other factors. If the frame 2 used is low in flatness, the holding sheet 3 warps that is fixed to the frame 2.

The second cause is of a case that the holding sheet 3 warps due to the shape of the substrate 1. The conveyance carrier 10 holds the substrate 1 so that it is kept approximately flat because the holding sheet 3 is under tension. However, for example, where the substrate 1 has a cut such as orientation flat, tension does not act on the substrate 1 uniformly from the holding sheet 3. In this case, a portion of the holding sheet 3 around the orientation flat is wrinkled to cause the holding sheet 3 to warp.

The third cause is of a case that the holding sheet 3 warps due to gravity. The conveyance carrier 10 holds the substrate 1 so that it is kept approximately flat because the holding sheet 3 is under tension. However, the holding sheet 3 elongates or the frame 2 is distorted due to the weights of the substrate 1 and the holding sheet 3 themselves, to cause a warp of the holding sheet 3.

The fourth cause is of a case that the holding sheet 3 warps due to stress that acts on the substrate 1. The substrate 1 receives stress that causes it to warp. On the other hand, the adhesion of the bonding of the substrate 1 to the holding sheet 3 and the tension that is exerted from the holding sheet 3 to the substrate 1 act against the stress on the substrate 1 and suppress the warp of the substrate 1 to keep it approximately flat. However, if the stress acting on the substrate 1 is too strong, the holding sheet 3 cannot suppress the warp of the substrate 1 sufficiently, as a result of which the holding sheet 3 expands and warps.

The electrostatic chuck electrode(s) (ESC electrode(s)) is generally classified into two types, that is, a single polarity type and a double polarity type. When a voltage is applied to the ESC electrode, absorption force acts between the ESC electrode and the holding sheet 3, whereby the conveyance carrier 10 can be absorbed on a stage 111.

The single-polarity ESC electrode consists of at least one electrode and a voltage of a fixed polarity is applied to all the electrodes. An electrostatic chuck mechanism having a single-polarity ESC electrode has an absorption mechanism that utilizes Coulomb force. By applying a voltage to all the electrodes, charge is induced in the surface of the stage 111 by dielectric polarization and the conveyance carrier 10 that is placed on the stage 111 is charged. As a result, Coulomb force acts between the charge induced in the surface of the stage 111 and the conveyance carrier 10 that is charged, whereby the conveyance carrier 10 is absorbed on the stage 111. The conveyance carrier 10 may be charged by generating plasma in a reaction chamber 103 and having the conveyance carrier 10 exposed to the plasma.

Figure 3:
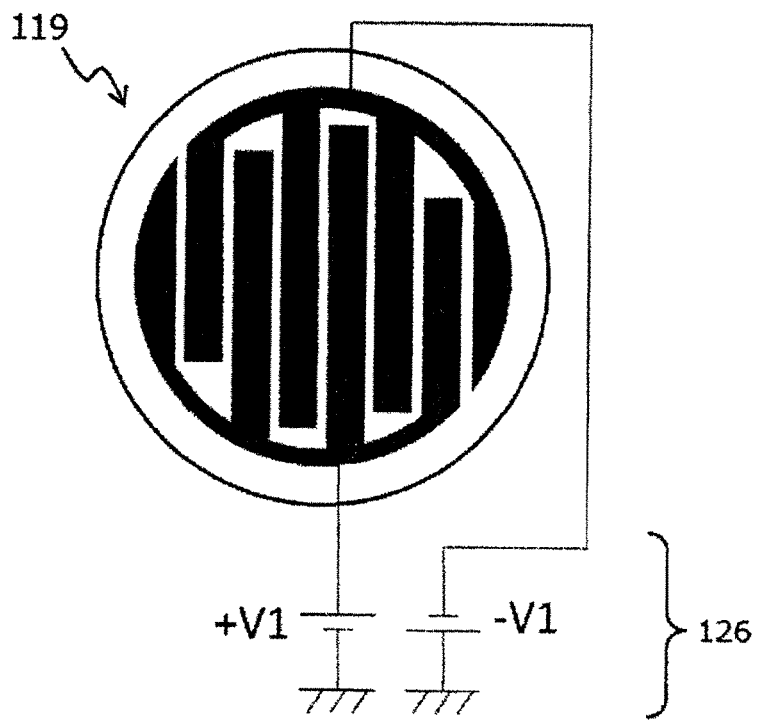
FIG. 3 is a conceptual diagram showing a relationship between ESC electrodes and a DC power source in the embodiments.

On the other hand, the double-polarity ESC electrodes have a positive electrode and a negative electrode to which voltages of different polarities are applied, respectively. Comb electrodes 119 shown in FIG. 3 are an example of the double-polarity ESC electrodes. As shown in FIG. 3, voltages V1 and −V1 are applied to the positive electrode and the negative electrode, respectively.

The absorption mechanism of the electrostatic chuck mechanism that is equipped with the double-polarity ESC electrodes is classified into one that utilizes Coulomb force and one that utilizes Johnsen-Rahbek force. A proper electrode structure and material (e.g., ceramic) are selected according to the absorption mechanism. In either absorption mechanism, voltages of different polarities are applied to the positive electrode and the negative electrode, whereby absorption force acts between the ESC electrodes and the conveyance carrier 10 and the conveyance carrier 10 can be absorbed on the stage 111. With the double-polarity ESC electrodes, unlike with the single-polarity ESC electrode, it is not necessary to charge the conveyance carrier 10 to have it absorbed.

It is possible to cause the double-polarity ESC electrodes to function as single-polarity ESC electrodes by employing a proper method for applying voltages to the positive electrode and the negative electrode, more specifically, by applying voltages of the same polarity to the positive electrode and the negative electrode. In the following description, a mode in which voltages of different polarities are applied to the positive electrode and the negative electrode of the double-polarity ESC electrodes is called a double-polarity mode, and a mode in which voltages of the same polarity are applied to the positive electrode and the negative electrode is called a single-polarity mode.

In the single-polarity mode, voltages of the same polarity are applied to the positive electrode and the negative electrode and an absorption mechanism that utilizes Coulomb force is employed. Unlike in the double-polarity mode, the conveyance carrier 10 cannot be absorbed merely by applying voltages to the positive electrode and the negative electrode. In the single-polarity mode, to have the conveyance carrier 10 absorbed, it is necessary to charge the conveyance carrier 10. To this end, plasma is generated in the reaction chamber 103 and the conveyance carrier 10 is exposed to the plasma. As a result, the conveyance carrier 10 is charged and thereby absorbed on the stage 111.

The single-polarity ESC electrode and the double-polarity ESC electrodes have been described above. In either case, it is possible to have the conveyance carrier 10 absorbed on the stage 111.

As described above, when a conveyance carrier 10 having a warped holding sheet 3 is mounted on the stage 111, the holding sheet 3 or the substrate 1 itself may be wrinkled. Such wrinkles may develop in either a region of the holding sheet 3 where it is not in contact with the substrate 1 or a region of the holding sheet 3 where it is in contact with the substrate 1. In the latter case, the substrate 1 itself that is bonded to the holding sheet 3 may be wrinkled.

Usually, to prevent the conveyance carrier 10 from being heated by plasma irradiation and thereby damaged thermally, the stage 111 is cooled to, for example, 15° C. or less. By cooling the stage 111, the conveyance carrier 10 that is mounted on the stage 111 is also cooled and is suppressed in thermal damage.

However, the holding sheet 3 may shrink when it is brought in contact with the cooled stage 111. Since the outer circumferential portion 3c of the holding sheet 3 is fixed to the frame 2, shrinkage of the holding sheet 3 is a cause of wrinkling of the holding sheet 3.

When a wrinkled conveyance carrier 10 is mounted on the stage 111 by the electrostatic chuck mechanism, at least a part of the wrinkles of the holding sheet 3 cannot come into contact with the stage 111 and the holding sheet 3 is absorbed on the stage 111 in such a manner that portions of the holding sheet 3 are elevated from the stage 111. If plasma processing is performed in a state such elevated portions occur in the region of the holding sheet 3 where it is in contact with the substrate 1, the degree of etching is made different between the elevated portions and the other portions to cause variations in processing result shapes or unprocessed portions. Furthermore, irrespective of where elevated portions are formed, local temperature increase or abnormal discharge may occur in the elevate portions. Such temperature increase or abnormal discharge may damage the substrate 1, the holding sheet 3, or the ESC electrode(s).

Still further, in a picking-up step which is executed after the plasma processing, wrinkling of the holding sheet 3 makes it difficult to recognize chips correctly, possibly resulting in pickup errors. In a subsequent appearance inspection step, trouble may occur that good products cannot be discriminated correctly from defective ones.

In first to third embodiments, the holding sheet 3 is absorbed on the stage 111 in a state that it is not wrinkled by varying the voltage(s) that is applied to the ESC electrode(s) 119 to absorb the holding sheet 3 on the stage 111.

In fourth to sixth embodiments, the holding sheet 3 is absorbed on the stage 111 in a state that it is not wrinkled by elevating and lowering the conveyance carrier 10 (repeatedly) near the stage 111 in mounting it on the stage 111.

(Plasma Processing Apparatus)

Figure 2:
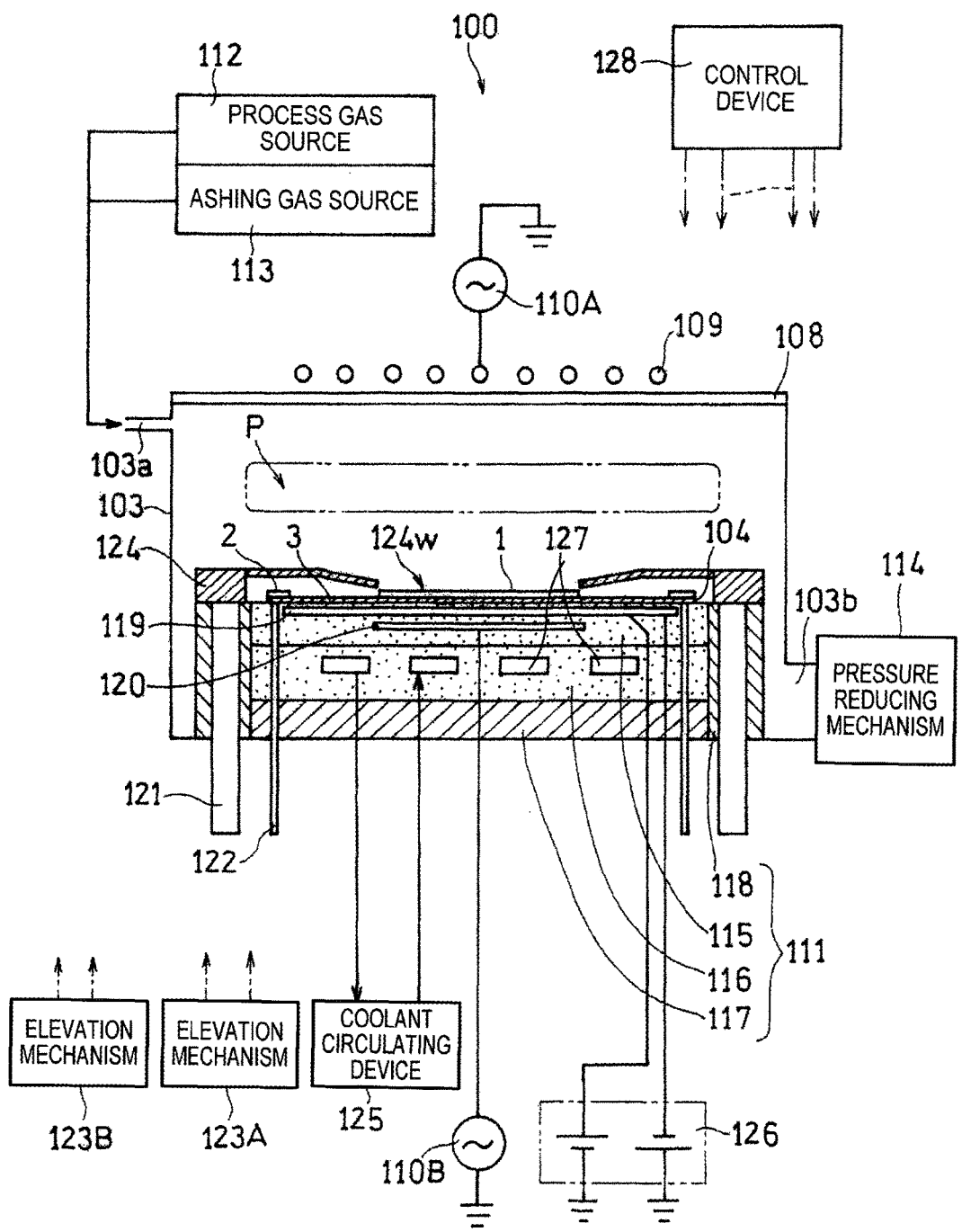
FIG. 2 is a conceptual diagram of a plasma processing apparatus according to the embodiments.

First, a plasma processing apparatus 100 according to the embodiments of the invention will be described with reference to FIG. 2. FIG. 2 is a schematic sectional view of the plasma processing apparatus 100 according to the embodiments of the invention.

The plasma processing apparatus 100 is equipped with the stage 111. The conveyance carrier 10 is mounted on the stage 111 in such a manner that the surface (adherent surface 3a) that holds a substrate 1 is up. A cover 124 which covers the frame 2 and at least a part of the holding sheet 3 and has a window 124W for exposing at least a part of the substrate 1 is disposed over the stage 111.

The stage 111 and the cover 124 are disposed in the reaction chamber (vacuum chamber) 103. The top of the vacuum chamber 103 is closed by a dielectric member 108, and an antenna 109 as a top electrode is disposed over the dielectric member 108. The antenna 109 is electrically connected to a first radio-frequency power source 110A. The stage 111 is disposed at the bottom of the reaction chamber 103.

A gas inlet 103a is connected to the vacuum chamber 103. A process gas source 112 which is a source of a plasma generation gas and an ashing gas source 113 are connected to the gas inlet 103a via respective pipes. The vacuum chamber 103 has an exhaust outlet 103b, and a pressure reducing mechanism 114 which includes a vacuum pump and serves to reduce the pressure in the vacuum chamber 103 by exhausting gas inside it is connected to the exhaust outlet 103b. A plasma generation unit consists of the antenna 109, the process gas source 112, and the first radio-frequency power source 110A.

The stage 111 is equipped with an approximately circular electrode layer 115 and metal layer 116, a base stage 117 which supports the electrode layer 115 and the metal layer 116, and an outer circumference portion 118 which surrounds the electrode layer 115, the metal layer 116, and the base stage 117. Disposed inside the electrode layer 115 are electrode(s) (hereinafter referred to as an ESC electrode(s)) 119 which is part of the electrostatic chuck mechanism, and a radio-frequency electrode member 120 which is electrically connected to a second radio-frequency power source 110B.

A DC power source 126 is electrically connected to the ESC electrode 119. The electrostatic chuck mechanism consists of the ESC electrode 119 and the DC power source 126.

For example, the metal layer 116 is an aluminum layer having a surface alumite coating. A coolant passage 127 is formed inside the metal layer 116 and serves to cool the stage 111. When the stage 111 is cooled, the conveyance carrier 10 that is mounted on the stage 111 is cooled and the cover 124 part of which is in contact with the stage 111 is also cooled. Coolant is circulated along the coolant passage 127 by a coolant circulating device 125.

Plural support portion 122 is disposed so as to penetrate through the stage 111 at positions near its outer circumference, and is driven, that is, elevated or lowered, by an elevation mechanism 123A. When the top surface 122a of the support portion 122 is located at a transfer position that is distant from the stage 111 upward, a conveyance carrier 10 is conveyed into the vacuum chamber 103 by a conveying mechanism (not shown) and transferred to the support portion 122. At this time, the support portion 122 supports the frame 2 of the conveyance carrier 10. Even desirably, the support portion 122 supports the overlap portion (i.e., the outer circumferential portion 3c of the holding sheet 3) between the frame 2 and the holding sheet 3 of the conveyance carrier 10.

When the top surface 122a of the support portion 122 is lowered to the same or lower level as or than the surface of the stage 111, the conveyance carrier 10 is mounted on the stage 111 at a prescribed position.

In the fourth to sixth embodiments, in mounting the conveyance carrier 10 on the stage 111, the top surface of the support portion 122 is elevated and lowered at least one time near the stage 111. The term "near the stage 111" means a range between a transfer position and a mounting position of the conveyance carrier 10, for example, a range over the surface of the stage 111 and within 0.1 to 5.0 mm of it. In the following description, an operation that the top surface of the support portion 122 is elevated and lowered (repeatedly) near the stage 111 in a process that the top surface of the support rod 122 are lowered from the transfer position to the mounting position will be referred to as an "elevation/lowering operation M."

Plural elevation rods 121 are connected to an end portion of the cover 124 so that the cover 124 can be elevated and lowered. The elevation rods 121 are driven, that is, elevated or lowered by an elevation mechanism 123B. The elevation mechanism 123B can perform an elevation/lowering operation independently of the elevation mechanism 123A.

A control device 128 controls operations of constituent elements of the plasma processing apparatus 100 which include the first radio-frequency power source 110A, the second radio-frequency power source 110B, the process gas source 112, the ashing gas source 113, the pressure reducing mechanism 114, the coolant circulating device 125, the elevation mechanisms 123A and 123B, and the electrostatic chuck mechanism.

(Frame)

The frame 2 is a frame body having an opening that is the same as or larger than the entire substrate 1 in area, and has a prescribed width and a small, approximately constant thickness. The frame 2 is rigid enough to hold and enable conveyance of the holding sheet 3 and the substrate 1.

Although there are no limitations on the shape of the opening of the frame 2, it may have a polygonal shape such as a circle, rectangle, or hexagon. The frame 2 may have notches 2a, corner cuts 2b, etc. for positioning. Example materials of the frame 2 are metals such as aluminum and stainless steel and resins. Part of one surface 3a of the holding sheet 3, that is, one surface of its outer circumferential portion 3c, is bonded to one surface of the frame 2.

(Holding Sheet)

For example, the holding sheet 3 has a surface having an adhesive (adherent surface 3a) and a surface having no adhesive (non-adherent surface 3b). Part of the adherent surface 3a, that is, one surface of its outer circumferential portion 3c, is bonded to one surface of the frame 2. The substrate 1 is bonded to a portion, exposed through the opening of the frame 2, of the adherent surface 3a.

It is preferable that the adherent surface 3a have an adhesive component whose adhesiveness is weakened when illuminated with ultraviolet light. This is to allow individual substrate portions (i.e., chips) to be peeled off the adherent surface 3a and picked up easily when they are illuminated with ultraviolet light after dicing. For example, the holding sheet 3 may be composed of an ultraviolet-curing acrylic adhesive layer (having the adherent surface 3a) and a polyolefin base sheet (having the non-adherent surface 3b). In this case, it is preferable that the thickness of the ultraviolet-curing acrylic adhesive layer be 5 to 20 μm and thickness of the polyolefin base sheet be 50 to 150 μm.

The holding sheet 3 may be conductive. Where the single-polarity ESC electrode or the double-polarity ESC electrodes that operate in the single-polarity mode are used, high absorption ability is obtained with respect to the stage 111 irrespective of whether the holding sheet 3 is conductive or not. On the other hand, where the double-polarity ESC electrodes that operate in the double-polarity mode are used, the absorption ability with respect to the stage 111 becomes low if the conductivity of the holding sheet 3 is low. Therefore, the conductive holding sheet 3 is particularly useful when the double-polarity ESC electrodes operate in the double-polarity mode because the conductive holding sheet 3 increases the absorption ability with respect to the stage 111.

(Substrate)

The substrate 1, which is an object of plasma processing, is not limited in any manner. There are no limitations on the material of the substrate 1. The substrate 1 may be a semiconductor, a dielectric, a metal, or a laminate thereof. Example semiconductors are silicon (Si), gallium arsenide (GaAs), gallium nitride (GaN), silicon carbide (SiC). Example dielectrics are silicon dioxide ($SiO_2$), silicon nitride ($Si_3N_4$), polyimide, lithium tantalate ($LiTaO_3$), and lithium niobate ($LiNbO_3$). There are no limitations on the size of the substrate 1, either. For example, the maximum diameter is about 50 to 300 mm and the thickness of the substrate 1 is about 25 to 150 μm. Furthermore, there are no limitations on the shape of the substrate 1. For example, the substrate 1 may be circular or rectangular. The substrate 1 may have a cut(s) (not shown) such as orientation flat or notches.

That surface of the substrate 1 which is not bonded to the holding sheet 3 is formed with a resist mask (not shown) in a desired pattern. The portions on which the resist mask is formed are protected from plasma etching. The portions on which the resist mask is not formed are etched by plasma from its front surface to back surface.

(Electrostatic Chuck Mechanism)

The applies a voltage(s) to the ESC electrode(s) 119 disposed inside the stage 111 (electrode layer 115) from the DC power source 126 and thereby having the conveyance carrier 10 absorbed on the stage 111 utilizing Coulomb force or Johnsen-Rahbek force that acts between the conveyance carrier 10 and the stage 111. The ESC electrode 119 is disposed so that their center approximately coincides with the center of the stage 111. The center of a minimum circle that contains all of the ESC electrode 119 can be regarded as the center of the ESC electrode 119.

The ESC electrode(s) 119 may be of either the double-polarity type (operating in the double-polarity mode or the single-polarity mode) or the single-polarity type. Where the ESC electrode(s) 119 is a single-polarity type ESC electrode or double-polarity type ESC electrodes operating in the single-polarity mode, the DC power source 126 and the first radio-frequency power source 110A are activated, whereby the conveyance carrier 10 is absorbed on the stage 111. More specifically, plasma is generated in the reaction chamber 103 and the surface of the conveyance carrier 10 is charged by activating the first radio-frequency power source 110A and a voltage(s) is applied to the single-polarity ESC electrode 119 or the double-polarity type ESC electrodes 119 operating in the single-polarity mode by activating the DC power source 126, whereby absorption force is generated between the conveyance carrier 10 and the stage 111.

Where the double-polarity type ESC electrodes 119 operate in the double-polarity mode, the DC power source 126 is activated, whereby the conveyance carrier 10 is absorbed on the stage 111. More specifically, absorption force is generated between the conveyance carrier 10 and the stage 111 by applying voltages of different polarities to the positive electrode and the negative electrode of the ESC electrodes 119 by activating the DC power source 126. The following description will be directed to the case that the ESC electrodes 119 are double-polarity type ESC electrodes. However, the invention is not limited to such a case.

FIG. 3 schematically shows a relationship between the double-polarity type ESC electrodes 119 and the DC power source 126. For example, the ESC electrodes 119 are comb electrodes as shown in FIG. 3. In FIG. 3, a positive voltage V1 and a negative voltage −V1 are applied to the positive electrode and the negative electrode, respectively. However, the shape of the ESC electrodes 119 is not restricted to it and may be determined as appropriate.

In the fourth to sixth embodiments, there are no limitations on the timing of a start of voltage application to the ESC electrode(s) 119; voltage application may be started before, during, or even after the elevation/lowering operation M. In any of these cases, the holding sheet 3 is unwrinkled by the elevation/lowering operation M and hence can be absorbed on the stage 111 in a state that it is not wrinkled.

In the first to third embodiments, the operation of applying a voltage(s) to the ESC electrode(s) 119 includes varying (i.e., increasing and decreasing) the absolute value of the application voltage. For example, the absolute value of the application voltage is varied in n cycles (n≥1) in such a pattern as to have values $V_n$, $W_n$, and $V_{n+1}$ in this order. The absolute value of the voltage $W_n$ is smaller than the absolute values of the voltages $V_n$ and $V_{n+1}$ ($|V_n|>|W_n|$, $|V_{n+1}|>|W_n|$) and may be equal to 0 ($|W_n|≥0$). The absolute value of the voltage $V_{n+1}$ may be either equal to or larger than the absolute value of the voltage $V_n$ ($|V_n|≤|V_{n+1}|$).

As the voltage(s) applied to the ESC electrode(s) 119 is varied, the holding sheet 3 is absorbed on the stage 111, then comes to be absorbed weakly (and separated from the stage 111), and absorbed strongly again. The holding sheet 3 is unwrinkled gradually in this process. That is, when the holding sheet 3 that has once been absorbed on the stage 111 in a wrinkled state is desorbed, the wrinkles are loosened. When the high voltage is applied again, the holding sheet 3 is absorbed again on the stage 111 in an unwrinkled state this time. It becomes easier to unwrinkle the holding sheet 3 by causing absorption and desorption, that is, application of a high voltage (V) and a low (or zero) voltage (W).

Unwrinkling (or reduction in the degree of wrinkling) of the holding sheet 3 will be described below. When a high voltage(s) (V) is applied to the ESC electrode(s) 119, absorption force is generated between the stage 111 and portions, actually in contact with the stage 111, of the holding sheet 3. At this time, wrinkles formed in the vicinities of the portions, actually in contact with the stage 111, of the holding sheet 3 are stretched by the absorption force acting on the actual contact portions of the holding sheet 3, whereby the actual contact portions are expanded. When a low (or zero) voltage(s) (W) is then applied to the ESC electrode 119, the absorption force between the stage 111 and portions becomes weaker. However, the shape of the holding sheet 3 having the expended actual contact portions is maintained. When a high voltage (V) is applied to the ESC electrode 119 again, absorption force acts on the expanded actual contact portions, whereby wrinkles in their vicinities are stretched and the actual contact portions are expanded further. The degree of wrinkling of the holding sheet 3 is lowered gradually as this process is executed repeatedly.

It is preferable that the high voltage (V) that is applied first to the ESC electrode 119 be smaller than or equal to, in absolute value, the high voltage (V) that is applied next. This is because if the high voltage (V) applied first is too large in absolute value, the effect of stretching wrinkles may not be obtained in a remarkable manner. That is, it is preferable to unwrinkle the holding sheet 3 to repeat weak absorption and stretching of wrinkles with application of a voltage having a small absolute value as the high voltage (V) that is applied to the ESC electrode 119 first and thereby expand portions, actually in contact with the stage 111, of the holding sheet 3 gradually. The high voltage (V) may be increased gradually in absolute value.

The voltage variation may be made in plural cycles. The number of cycles of voltage variation is not limited to any particular range and may be two to five, for example. For example, one voltage variation cycle means a voltage variation pattern $V_n→W_n→V_{n+1}$. For example, two voltage variation cycles mean a voltage variation pattern $V_n→W_n→V_{n+1}→W_{n+1}→V_{n+2}$. It suffices that the voltage be varied in at least one cycle from a start of voltage application to execution of plasma processing. For example, voltages may be applied to the ESC electrode 119 in such a manner as to include the pattern $V_n→W_n→V_{n+1}$ at least once from a start of voltage application to execution of plasma processing.

After varied in plural cycles, the application voltage is adjusted to a prescribed voltage and plasma processing is performed. The prescribed voltage that is applied when plasma processing is performed is not limited to any particular range, and may be, for example, higher than $V_n$. In the following, varying the voltage(s) applied to the ESC electrode(s) 119 in such a manner that it includes at least one voltage variation cycle (i.e., includes the pattern $V_n→W_n→V_{n+1}$ at least once) will be referred to as a "variable voltage application I."

The first to third embodiments will be described below in detail. However, the invention is not limited to these embodiments and various modifications are possible.

First Embodiment

Figure 4:
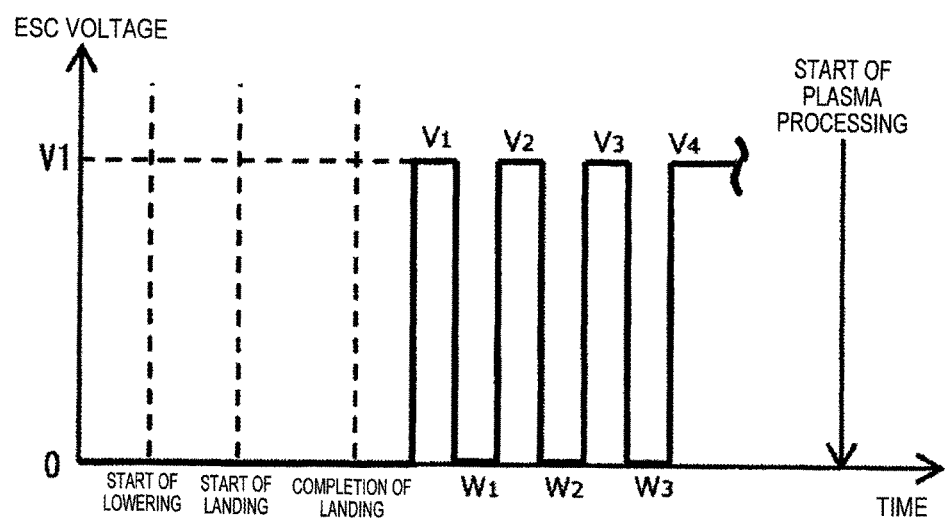
FIG. 4 is a conceptual graph showing an operation of a plasma processing apparatus according to a first embodiment of the invention in which the horizontal axis represents the time from a start of lowering of a support portion and the vertical axis represents the voltage(s) applied to the ESC electrode(s).
Figure 6A:
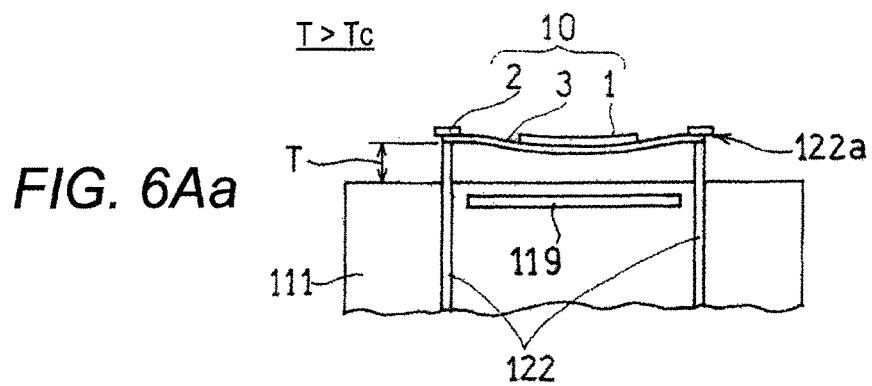
FIGS. 6Aa to 6Ad are conceptual diagrams showing an operation of the plasma processing apparatus according to the first embodiment from a start of lowering of the support portion to mounting of the conveyance carrier on a stage.
Figure 6A:
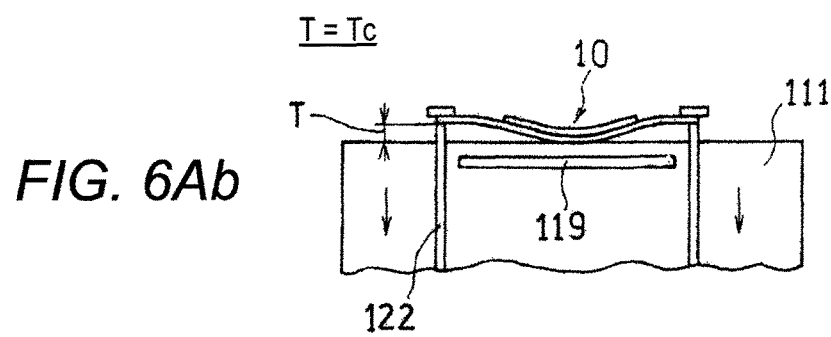
Figure 6A:
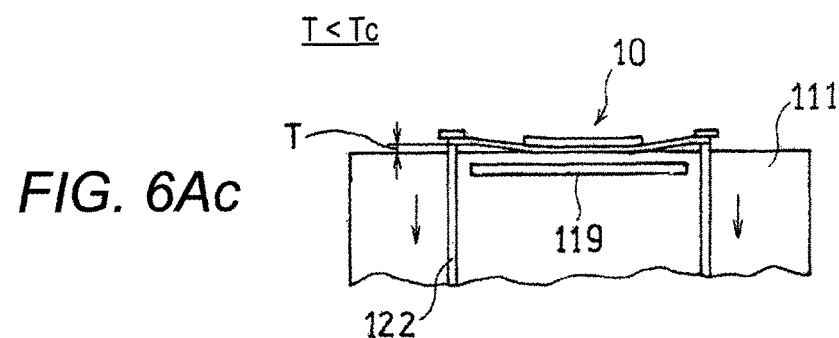
Figure 6A:
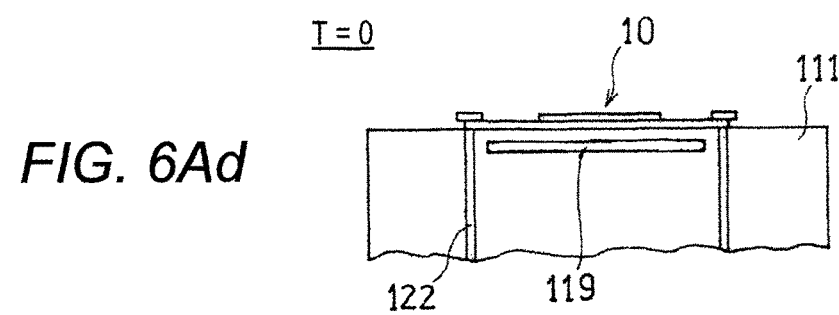
Figure 6B:
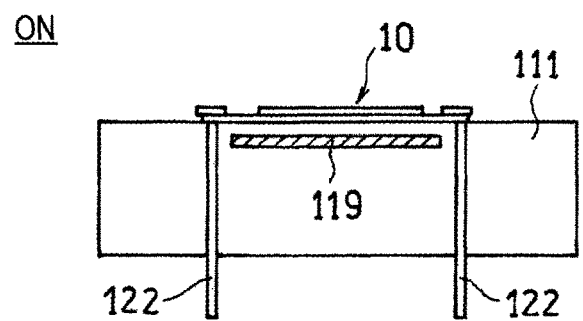
FIGS. 6Ba to 6Bd are conceptual diagrams showing a variable voltage application I that is performed by the plasma processing apparatus according to the first embodiment.
Figure 6B:
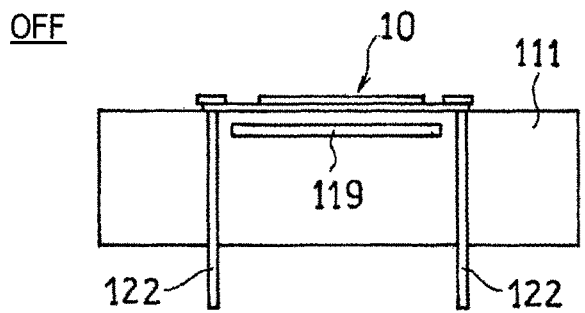
Figure 6B:
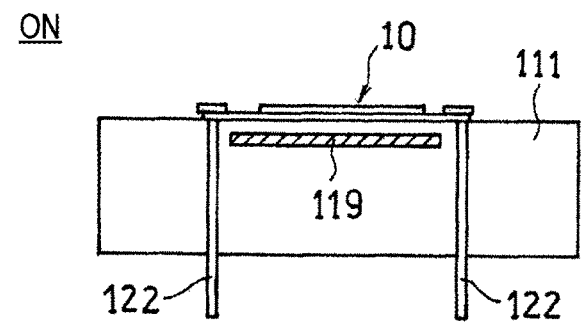
Figure 6B:
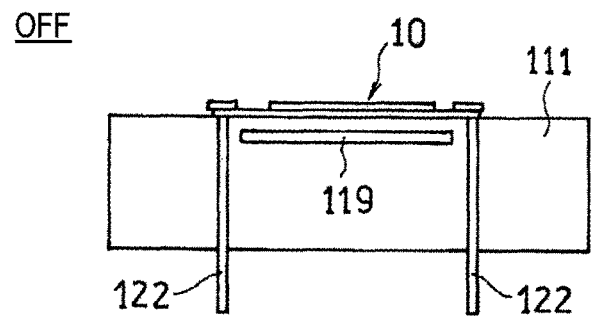

In the first embodiment, a variable voltage application I is done in a pattern shown in FIG. 4. That is, the voltage(s) (V) applied to the ESC electrode(s) 119 is varied (increased and decreased) in a pattern V1 ($V_1$)→0 ($W_1$)→V1 ($V_2$)→0 ($W_2$)→V1 ($V_3$)→0 ($W_3$)→V1 ($V_4$) (n=3). For example, this pattern is realized by turning on and off the DC power source 126 repeatedly as shown in FIG. 6B. FIG. 4 is a conceptual graph in which the horizontal axis represents the time from a start of lowering of the support portion 122 and the vertical axis represents the voltage(s) applied to the ESC electrode(s) 119.

A time point when the support portion 122 that supports the conveyance carrier 10 starts to be lowered is indicated in FIG. 4. The term "start of landing" means a time point when the lowest point of a warped portion of the holding sheet 3 of the conveyance carrier 10 just comes into contact with the stage 111. The term "completion of landing" means a time point when the top surface 122a of the support portion 122 has been lowered to the same or lower level as or than the surface of the stage 111 and (at least a part of) the outer circumferential portion 3c of the holding sheet 3 just comes into contact the stage 111.

Whether or not the lowest point of the warped portion of the holding sheet 3 has touched the stage 111 is determined on the basis of, for example, a distance D of lowering of the top surface 122a of the support portion 122. A warp Tc (described later) of the holding sheet 3 that is held by the conveyance carrier 10 is measured, and a lowering distance D of the support portion 122 that occurs when the distance T between the top surface 122a of the support portion 122 and the surface of the stage 111 becomes equal to Tc is recognized in advance. A time point when the lowering distance of the support portion 122 has become equal to D is regarded as a time point when the lowest point of the warped portion of the holding sheet 3 being held by the conveyance carrier 10 has just touched the stage 111.

Figure 5:
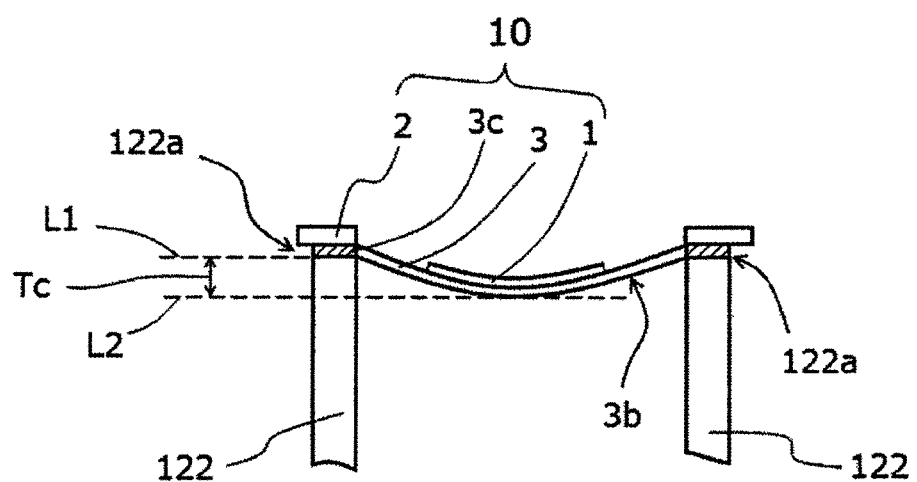
FIG. 5 illustrates a warp of a holding sheet that occurs in the first embodiment.

For example, a warp Tc is determined in the following manner. As shown in FIG. 5, the conveyance carrier 10 is placed on the top surface 122*a* of the support portion 122 that is located at such a height that the holding sheet 3 is not in contact with the stage 111. In this state, in a cross section taken so as to pass the center of the conveyance carrier 10, the warp Tc is determined as a distance between a straight line L1 that passes the bottom surface of the outer circumferential portion 3*c* of the holding sheet 3 and a tangential line L2 to the bottom surface (3*b*) of a warped portion of the holding sheet 3 at its lowest point.

It is not always necessary to measure a warp Tc in the reaction chamber 103 or the plasma processing apparatus 100. For example, a warp Tc may be measured by, for example, a noncontact optical measuring instrument before processing by the plasma processing apparatus 100. To facilitate understanding, the warp Tc is exaggerated in FIG. 5. For example, a warp Tc of about 50 to 800 μm occurs in the case where the diameter of the frame 2 is about 300 mm, the diameter and the thickness of the substrate 1 are about 150 mm and about 100 mm, respectively, and the thickness of the holding sheet 3 is about 110 μm.

In FIG. 4, the voltage(s) applied to the ESC electrode(s) 119 is once set as 0 (V) ($W_n=0$). The voltage $W_n$ is not limited to any particular range as long as it is smaller in absolute value than the voltages $V_n$ and $V_{n+1}$. For example, the $W_n$ may be opposite in polarity to the voltage $V_n$ and/or the voltage $V_{n+1}$. From the viewpoint of suppressing residual absorption, it is preferable that the voltage $W_n$ be set as 0 (V).

The variable voltage application I will be described with reference to FIGS. 6Aa to 6Ad and FIGS. 6Ba to 6Bd. FIGS. 6Aa to 6Ad conceptually show an operation from a start of lowering of the support portion 122 that supports the conveyance carrier 10 to mounting of the conveyance carrier 10 on the stage 111. FIGS. 6Ba to 6Bd conceptually show a variable voltage application I. To facilitate understanding, the ESC electrode(s) 119 to which a voltage(s) is applied is hatched in FIGS. 6Aa to 6Ad and FIGS. 6Ba to 6Bd. Also in FIGS. 6Aa to 6Ad and FIGS. 6Ba to 6Bd, warps are exaggerated for the sake of description.

As shown in FIG. 6Aa, first, the support portion 122 that supports the conveyance carrier 10 starts to be lowered. At this time, the distance T between the top surface 122*a* of the support portion 122 and the stage 111 is longer than the warp Tc (T>Tc). The support portion 122 continues to be lowered, and as shown in FIG. 6Ab the lowest point of the warped portion of the holding sheet 3 comes into contact with the stage 111 (T=Tc). The support portion 122 still continues to be lowered as shown in FIG. 6Ac and the land of the holding sheet 3 on the stage 111 is completed as shown in FIG. 6Ad.

As shown in FIGS. 6Ba to 6Bd, a variable voltage application I is performed after the completion of landing of the holding sheet 3 shown in FIG. 6Ad. The variable voltage application I is performed in a state that at least a part of the outer circumferential portion 3*c* of the holding sheet 3 is in contact with the stage 111. The whole of the outer circumferential portion 3*c* of the holding sheet 3 may be in contact with the stage 111. A certain voltage(s) (e.g., V1) may be applied to the ESC electrode(s) 119 before the completion of landing of the holding sheet 3 (T>0, from the state of FIG. 6Aa to the state of FIG. 6Ac).

Where the holding sheet 3 is in contact with the stage 111 in a state that it is wrinkled, the holding sheet 3 is absorbed on the stage 111 as it is when the voltage V1 is applied to it. Then a voltage W1 that is lower than the voltage V1 is applied to the ESC electrode 119, whereby the absorption force acting between portions, actually in contact with the stage 111, of the holding sheet 3 and the stage 111 is weakened. As a result, wrinkles in the vicinities of the actual contact portions of the holding sheet 3 become loose temporarily. Then the voltage V1 is applied again, whereby the holding sheet 3 is absorbed in a state that it is unwrinkled. The holding sheet 3 can be unwrinkled more easily by performing the voltage variation repeatedly. Subsequently, plasma processing is performed with a prescribed voltage(s) applied to the ESC electrode(s) 119, whereby the substrate 1 is etched uniformly.

How the plasma processing apparatus 100 operates will be described below in a specific manner with reference to FIGS. 7A to 7E. Also in FIGS. 7A to 7E, warps are exaggerated for the sake of description.

Figure 7A:
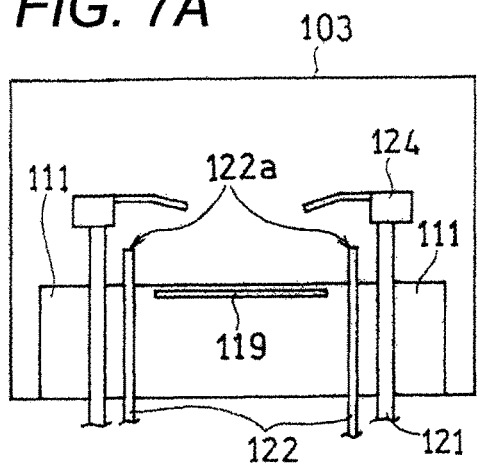
FIGS. 7A to 7E are conceptual diagrams showing an operation of the plasma processing apparatus according to the first embodiment.

In the vacuum chamber 103, as shown in FIG. 7A, the support portion 122 stands by at the elevated position for support of the conveyance carrier 10 and the cover 124 also stands by at the elevated position. As shown in FIG. 7B, the conveyance carrier 10 is carried into the vacuum chamber 103 by the conveying mechanism (not shown) and transferred to the support portion 122.

The conveyance carrier 10 is placed on the top surface 122*a* of the support portion 122 in such a manner that the surface (adherent surface 3*a*), holding the substrate 1, of the holding sheet 3 is located up. The frame 2 may be placed on the top surface 122*a* of the support portion 122 either via the outer circumferential portion 3*c* of the holding sheet 3 or directly. From the viewpoint of preventing the holding sheet 3 from peeling off the frame 2 when the support portion 122 is elevated or lowered, it is preferable that the conveyance carrier 10 be placed on the top surface 122*a* of the support portion 122 via the outer circumferential portion 3*c* of the holding sheet 3.

Figure 7D:
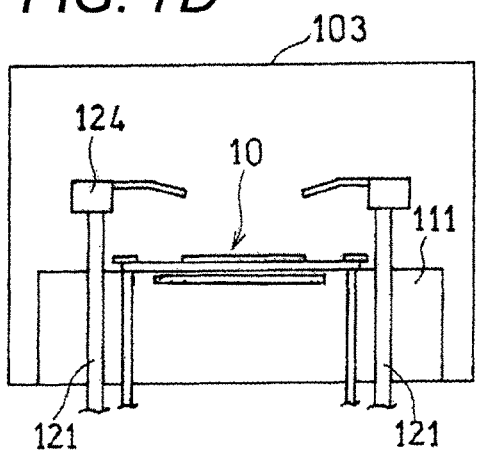
Figure 7B:
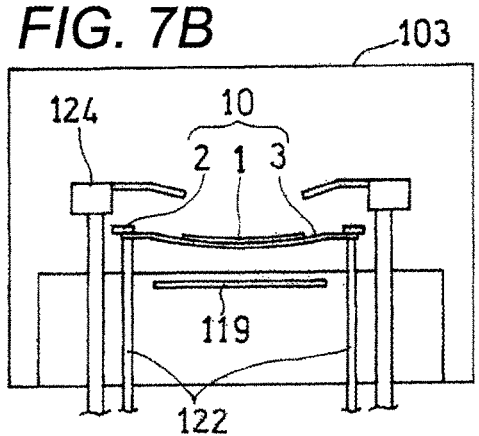
Figure 7E:
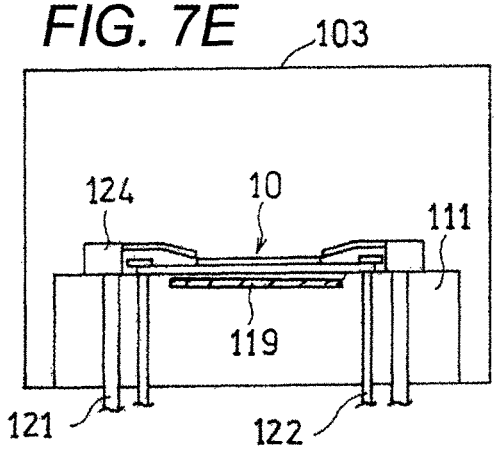
Figure 7C:
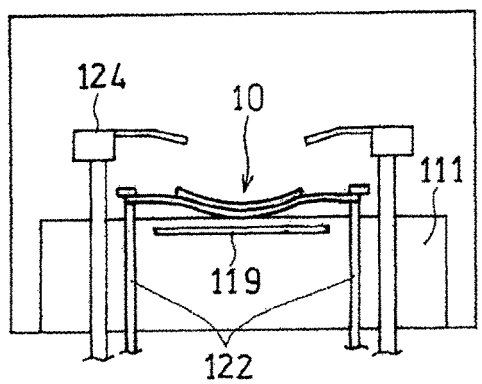

Then the support portion 122 is lowered as shown in FIG. 7C. The support portion 122 is lowered further, whereby the outer circumferential portion 3*c* of the holding sheet 3 comes into contact with the stage 111 and the conveyance carrier 10 is mounted on the stage 111 at the prescribed position (see FIG. 7D). If the top surface 122*a* of the support portion 122 has been lowered to the same or lower level as or than the surface of the stage 111, it can be determined that the outer circumferential portion 3*c* of the holding sheet 3 is in contact with the stage 111.

In the state of FIG. 7D, a variable voltage application I is performed as shown in FIG. 6B. After completion of the variable voltage application I, as shown in FIG. 7E the elevation rods 121 are driven by the elevation mechanism 123B and thereby lower the cover 124 to a prescribed position.

Where the ESC electrode 119 is of the single-polarity type, plasma is generated in the vacuum chamber 103 by inputting low power (e.g., 500 W or less) to the antenna 109 from the first radio-frequency power source 110A after the placement of the conveyance carrier 10 on the top surface 122*a* of the support portion 122 and the exit of the conveying mechanism from the vacuum chamber 103 before application of a voltage to the ESC electrode 119. As a result, the surface of the conveyance carrier 10 is charged to establish a state that the conveyance carrier 10 can be absorbed on the stage 111 upon application of a voltage to the ESC electrode 119.

When the cover 124 has been set at the prescribed lowered position, the frame 2 and the portion of the holding sheet 3 that is not holding the substrate 1 are covered with the cover 124 without being in contact with it and the substrate 1 is exposed through the window 124W of the cover 124.

For example, the portion, excluding the end portion, of the cover 124 has a doughnut shape having an approximately circular outline and has a prescribed width and a small thickness. The inner diameter (i.e., the diameter of the window 124W) and the outer diameter of the portion, excluding the end portion, of the cover 124 is smaller than the inner diameter of the frame 2 and larger than the outer diameter of the frame 2, respectively. Therefore, when the conveyance carrier 10 is mounted on the stage 111 at the prescribed position and the cover 124 has been lowered, the frame 2 and at least a part of the holding sheet 3 can be covered with the cover 124. At least a part of the substrate 1 is exposed through the window 124W. At this time, the cover 124 is in contact with none of the frame 2, the holding sheet 3, and the substrate 1. Example materials of the cover 124 are ceramic materials such as alumina and aluminum nitride, dielectrics such as quartz, and metals such as aluminum (including a case that the surface is alumite-treated).

When the support portion 122 and the cover 124 have been set at the prescribed positions, process gas is introduced into the vacuum chamber 103 from the process gas source 112 via the gas inlet 103*a*. On the other hand, the pressure reducing mechanism 114 exhausts gas from the vacuum chamber 103 via the exhaust outlet 103*b* to maintain a prescribed pressure in the vacuum chamber 103.

Then plasma P is generated in the vacuum chamber 103 by inputting radio-frequency power to the antenna 109 from the first radio-frequency power source 110A. The generated plasma P is composed of ions, electrons, radicals, etc. Plasma processing on the substrate 1 is started by inputting radio-frequency power to the radio-frequency electrode 120 from the second radio-frequency power source 110B. The energy of incidence of ions on the substrate 1 can be controlled by the bias voltage that is applied from the second radio-frequency power source 110B to the radio-frequency electrode 120. The portions, exposed from the resist mask formed on the substrate 1, of the substrate 1 are removed from their top surfaces to bottom surfaces by a physicochemical reaction to the generated plasma P, whereby the substrate 1 is divided into individual pieces.

The plasma processing conditions are set according to the material of the substrate and other factors. For example, an Si substrate 1 is etched by generating plasma P of a fluorine-inclusive gas such as sulfur hexafluoride ($SF_6$) in the vacuum chamber 103. In this case, for example, the pressure in the vacuum chamber 103 is controlled to 10 to 50 Pa by the pressure reducing mechanism 114 while an $SF_6$ gas is supplied from the process gas source 112 at 100 to 800 sccm. Radio-frequency power of 1,000 to 5,000 W and 13.56 MHz is supplied to the antenna 109 and radio-frequency power of 50 to 1,000 W and 13.56 MHz is supplied to the radio-frequency electrode 120. At the same time, to suppress temperature increase of the conveyance carrier 10 due to the plasma processing, the temperature of the coolant that is being circulated in the stage 111 by the coolant circulating device 125 is set as −20 to 20° C. As a result, the temperature of the conveyance carrier 10 under plasma processing can be made lower than or equal to 100° C.

It is desirable that in the etching processing the portions, exposed from the resist mask, of the substrate 1 be etched perpendicularly to their surfaces. To this end, for example, an etching step using plasma of a fluorine-based gas such as $SF_6$ and a protection film deposition step using plasma of a carbon fluoride gas such as perfluorocyclobutane ($C_4F_8$) may be executed alternately.

After the generation of plasma P, the operation mode of the ESC electrodes 119 may be switched from the double-polarity mode to the single-polarity mode. Where the operation mode of the ESC electrodes 119 is the double-polarity mode, the surface of the substrate 1 over the positive electrode of the ESC electrodes 119 (positive-electrode-side surface) and the surface of the substrate 1 over the negative electrode of the ESC electrodes 119 (negative-electrode-side surface) are slightly different from each other in potential. Furthermore, the positive-electrode-side surface receives stronger Coulomb force than the negative-electrode-side surface. Therefore, the two kinds of surfaces receive slightly different absorption forces.

As a result, if plasma processing is started in the double-polarity mode, the difference, between the positive-electrode-side surface and the negative-electrode-side surface, in the absorption force acting between the conveyance carrier 10 and the stage 111 causes temperature differences in the substrate 1. Furthermore, the positive-electrode-side surface and the negative-electrode-side surface may have differences in the effective bias voltage applied to the substrate 1. Still further, the positive-electrode-side surface and the negative-electrode-side surface may have differences in the degree of etching. These are factors that may make it difficult to perform uniform plasma processing on the substrate 1.

For example, the switching from the double-polarity mode to the single-polarity mode is made by inverting the polarity of the voltage that is applied to one of the positive electrode and the negative electrode or changing the voltage that is applied to one of the positive electrode and the negative electrode so that it becomes equal to the voltage applied to the other electrode.

When switching is made from the double-polarity mode to the single-polarity mode, there may occur an event that the absorption force between the conveyance carrier 10 and the stage 111 weakens instantaneously and the cooling of the conveyance carrier 10 becomes insufficient. In view of this, it is preferable that the switching from the double-polarity mode to the single-polarity mode be made during a period when low power (e.g., 500 W) is input from the first radio-frequency power source 110A to the antenna 109.

In other words, the operation mode of the ESC electrodes 119 is switched from the double-polarity mode to the single-polarity mode while low-power plasma is being generated by inputting low power to the antenna 109 from the first radio-frequency power source 110A. It is preferable to perform plasma processing by inputting high power to the antenna 109 from the first radio-frequency power source 110A after completion of the switching (see FIG. 8C). Where the power that is input to the antenna 109 is low, the energy of generated plasma is low and hence the amount of heat that is transmitted from the plasma to the conveyance carrier 10 is small. Therefore, the necessity to cause the conveyance carrier 10 to be absorbed on the stage 111 strongly is low. As a result, trouble is less prone to occur due to insufficient cooling of the conveyance carrier 10 when switching is made from the double-polarity mode to the single-polarity mode.

The voltage applied to each ESC electrode 119 may be increased after the switching to the single-polarity mode before a start of plasma processing. FIGS. 8A and 8B are conceptual graphs in which the horizontal axis represents the time from a start of input of power to the antenna 109 from the first radio-frequency power source 110A and the vertical axis represents the voltage that is applied to each ESC electrode 119. As shown in FIGS. 8A and 8B, after the switching to the single-polarity mode, the voltage applied to each ESC electrode 119 is increase to +V2 stepwise so that the conveyance carrier 10 is absorbed on the stage 111 with sufficient strength. Then plasma processing is started by inputting high power to the antenna 109 from the first radio-frequency power source 110A.

The above operation will be described below in a more specific manner. For example, in the double-polarity mode, the positive electrode voltage is 1,500 V (+V1) and the negative electrode voltage is −1,500 V (−V1). And the power that is input to the antenna 109 is low power of 500 W. Then switching is made from the double-polarity mode to the single-polarity mode by changing the negative electrode voltage from −1,500 V (−V1) to 1,500 V (+V1). Subsequently, the positive electrode voltage and the negative electrode voltage are increased stepwise to 3,000 V (+V2). Finally, the power that is input to the antenna 109 is increased to high power of 2,000 to 5,000 W and plasma processing is performed. In this manner, the conveyance carrier 10 can be absorbed on the stage 111 strongly and cooled reliably during plasma processing while occurrence of trouble due to the switching from the double-polarity mode to the single-polarity mode is prevented.

Ashing is performed after the fragmentation. An ashing process gas (e.g., an oxygen gas or a mixed gas of an oxygen gas and a fluorine-inclusive gas) is introduced into the vacuum chamber 103 from the ashing gas source 113. On the other hand, exhaust is performed by the pressure reducing mechanism 114, whereby the pressure in the vacuum chamber 103 is kept at a prescribed value. Oxygen plasma is generated in the vacuum chamber 103 by inputting radio-frequency power from the first radio-frequency power source 110A, whereby the resist mask that is formed on the surface, exposed through the window 124W of the cover 124, of the substrate 1 (chips) is removed completely.

Finally, the conveyance carrier 10 which holds the fragmented substrate 1 is carried out of the plasma processing apparatus 100. The substrate 1 may be carried out according to a procedure that is reverse to the procedure for mounting the substrate 1 on the stage 111 which is shown in FIGS. 7A to 7E. That is, after the cover 124 is elevated to a prescribed position, the absorption of the conveyance carrier 10 on the stage 111 is canceled by decreasing the voltages applied to the ESC electrodes 119 to zero and the support portion 122 is elevated.

If the conveyance carrier 10 is kept absorbed on the stage 111 because part of the charge that was produced at the time of the plasma processing remains in the conveyance carrier 10, if necessary, the residual charge may be removed from the conveyance carrier 10 by generating weak plasma by inputting low radio-frequency power of, for example, about 200 W to the antenna 109 from the first radio-frequency power source 110A before or during the elevation of the top surface 122a of the support portion 122.

Second Embodiment

The second embodiment is the same as the first embodiment except that the former employs a voltage variation pattern in which the voltage $V_{n+1}$ is higher than the voltage $V_n$. In other words, in this embodiment, a high voltage $V_{n+1}$ that is applied after a low voltage $W_n$ in each voltage variation cycle is set higher in absolute value than the latter.

FIG. 9 show a variable voltage application I employed in the embodiment. As shown in FIG. 9, the voltage(s) (V) applied to the ESC electrode(s) 119 is varied in a pattern V1 ($V_1$)→0 ($W_1$)→V2 ($V_2$; V2>V1)→0 ($W_2$)→V3 ($V_3$; V3>V2)→0 ($W_3$)→V3 ($V_4$) (n=3). For example, this pattern is realized by performing, three times, an operation of turning off the DC power source 126, then adjusting the DC power source 126 so that it will output a voltage that is higher than a voltage that it output before the turning-off, and then turning on the DC power source 126.

FIG. 9 is a conceptual graph in which the horizontal axis represents the time from a start of lowering of the support portion 122 and the vertical axis represents the voltage(s) applied to the ESC electrode(s) 119. With the employment of the pattern of FIG. 9 in which the application voltage increases gradually, the holding sheet 3 is absorbed on the stage 111 in such a manner that wrinkles have been removed even more. The absorption force acting on the holding sheet 3 from the stage 111 becomes stronger as the voltage applied to the ESC electrode 119 increases. Wrinkles that could not be removed by absorption with application of a certain voltage may be removed by canceling (or weakening) the absorption temporarily and then applying a higher voltage to the ESC electrode 119 because of stronger absorption force acting on the holding sheet 3.

Third Embodiment

The third embodiment is the same as the first embodiment except that the former employs a voltage variation pattern in which the voltage is opposite in polarity to the voltage $V_n$. In other words, in this embodiment, a high voltage $V_{n+1}$ that is applied after a low voltage $V_n$ in a certain voltage variation cycle is reversed in polarity from a high voltage $V_n$ of the immediately preceding cycle.

Figure 10:
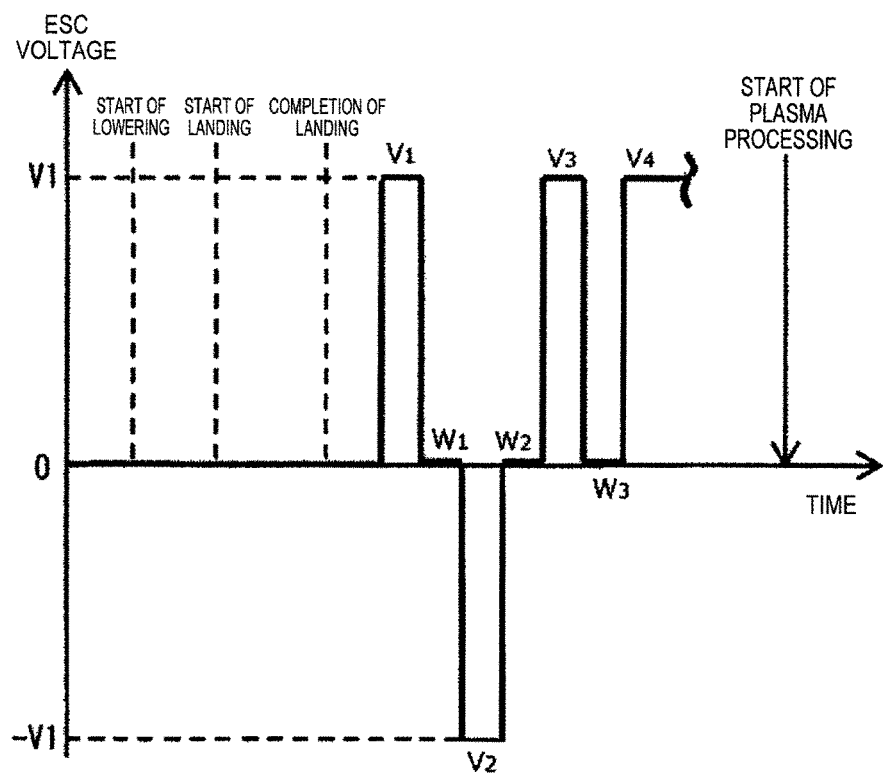
FIG. 10 is a conceptual graph showing an operation of a plasma processing apparatus according to a third embodiment of the invention in which the horizontal axis represents the time a start of lowering of the support portion and the vertical axis represents the voltage applied to one of the ESC electrodes.

FIG. 10 shows a variable voltage application I employed in the embodiment. As shown in FIG. 10, the voltage(s) (V) applied to one of the ESC electrode(s) 119 is varied in a pattern V1 ($V_1$)→0V ($W_1$)→−V1 ($V_2$)→0V ($W_2$)→V1 ($V_3$)→0V ($W_3$)→V1 ($V_4$) (n=3). For example, this pattern is realized by turning on and off the DC power source 126 three times using a polarity reversing switch. FIG. 10 is a conceptual graph in which the horizontal axis represents the time from a start of lowering of the support portion 122 and the vertical axis represents the voltage applied to one of the ESC electrodes 119.

When the polarity of the application voltage is reversed, switching is made between the portion of the substrate 1 that corresponds to the ESC positive electrode and the portion of the substrate 1 that corresponds to the ESC negative electrode. As a result, residual absorption is suppressed and wrinkles of the holding sheet 3 are loosened to a larger extent when the DC power source 126 is turned off. Thus, the holding sheet 3 can be unwrinkled even more easily.

Next, the fourth to sixth embodiments will be described below in detail. However, the invention is not limited to these embodiments and various modifications are possible.

Fourth Embodiment

Figure 11A:
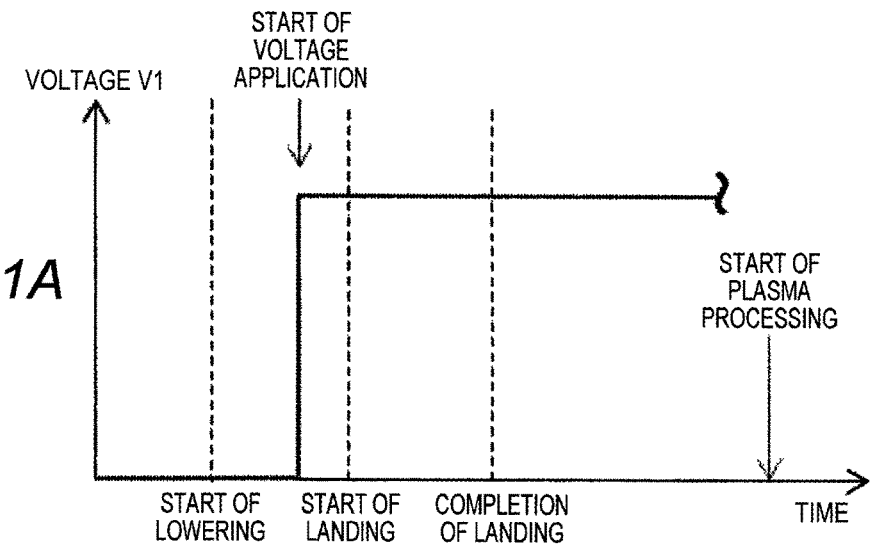
FIGS. 11A and 11B show an operation of a plasma processing apparatus according to a fourth embodiment of the invention.
Figure 11B:
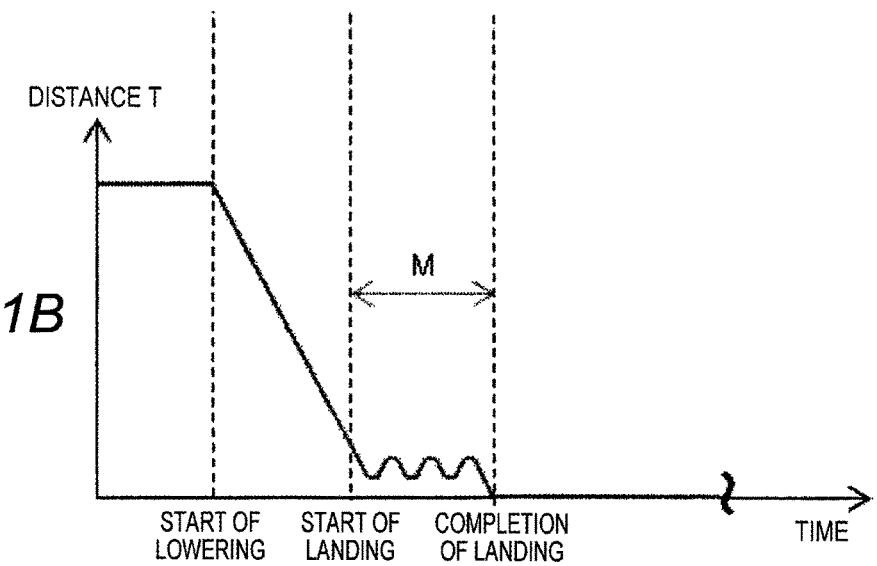

In the fourth embodiment, an elevation/lowering operation M is performed after a start of voltage application to the ESC electrode(s) 119. FIG. 11A is a conceptual graph in which the horizontal axis represents the time from a start of lowering of the support portion 122 and the vertical axis represents the voltage(s) applied to the ESC electrode(s) 119. FIG. 11B is a conceptual graph in which the horizontal axis represents the time from the start of lowering of the support portion 122 and the vertical axis represents the distance T between the top surface 122a of the support portion 122 and the stage 111.

A time point when the support portion 122 that supports the conveyance carrier 10 starts to be lowered is indicated in FIGS. 11A and 11B. The term "start of landing" means a time point when the lowest point of a warped portion of the holding sheet 3 of the conveyance carrier 10 just comes into contact with the stage 111. The term "completion of landing" means a time point when the top surface 122a of the support portion 122 has been lowered to the same or lower level as or than the surface of the stage 111 and the outer circumferential portion 3c of the holding sheet 3 just comes into contact the stage 111.

Whether or not the lowest point of the warped portion of the holding sheet 3 has touched the stage 111 is determined on the basis of, for example, a distance D of lowering of the top surface 122a of the support portion 122. A warp Tc (described later) of the holding sheet 3 that is held by the conveyance carrier 10 is measured, and a lowering distance D of the support portion 122 that occurs when the distance T between the top surface 122a of the support portion 122 and the surface of the stage 111 becomes equal to Tc is recognized in advance. A time point when the lowering distance of the support portion 122 has become equal to D is regarded as a time point when the lowest point of the warped portion of the holding sheet 3 being held by the conveyance carrier 10 has just touched the stage 111.

For example, a warp Tc is determined in the following manner. As shown in FIG. 5, the conveyance carrier 10 is placed on the top surface 122a of the support portion 122 that is located at such a height that the holding sheet 3 is not in contact with the stage 111. In this state, in a cross section taken so as to pass the center of the conveyance carrier 10, the warp Tc is determined as a distance between a straight line L1 that passes the bottom surface of the outer circumferential portion 3c of the holding sheet 3 and a tangential line L2 to the bottom surface (3b) of a warped portion of the holding sheet 3 at its lowest point.

It is not always necessary to measure a warp Tc in the reaction chamber 103 or the plasma processing apparatus 100. For example, a warp Tc may be measured by, for example, a noncontact optical measuring instrument before processing by the plasma processing apparatus 100. To facilitate understanding, the warp Tc is exaggerated in FIG. 5. For example, a warp Tc of about 50 to 800 μm occurs in the case where the diameter of the frame 2 is about 300 mm, the diameter and the thickness of the substrate 1 are about 150 mm and about 100 mm, respectively, and the thickness of the holding sheet 3 is about 110 μm.

As shown in FIGS. 11A and 11B, the holding sheet 3 starts to land after a start of voltage application and an elevation/lowering operation M is performed until completion of landing. However, the timing of execution of an elevation/lowering operation M is not limited this timing; for example, an operation is possible that the support portion 122 is elevated again after completion of landing of the holding sheet 3 and an elevation/lowering operation M is performed thereafter.

Figure 12A:
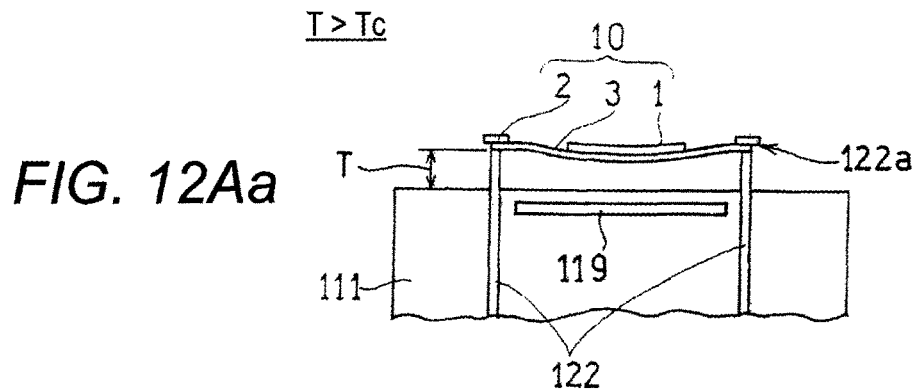
FIGS. 12Aa to 12Ad are conceptual diagrams showing an operation of the plasma processing apparatus according to the fourth embodiment from a start of lowering of the support portion to mounting of the conveyance carrier on the stage.
Figure 12A:
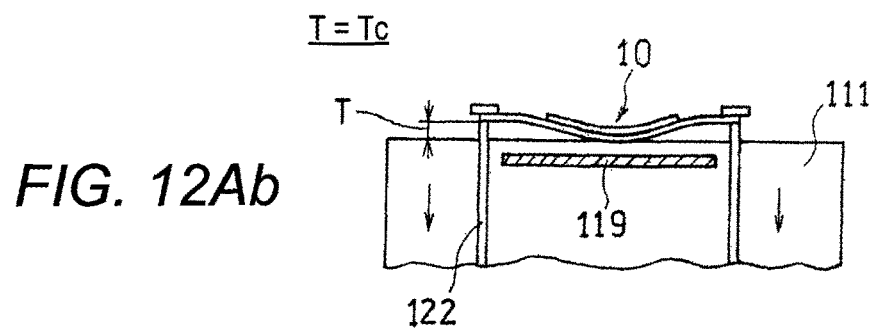
Figure 12A:
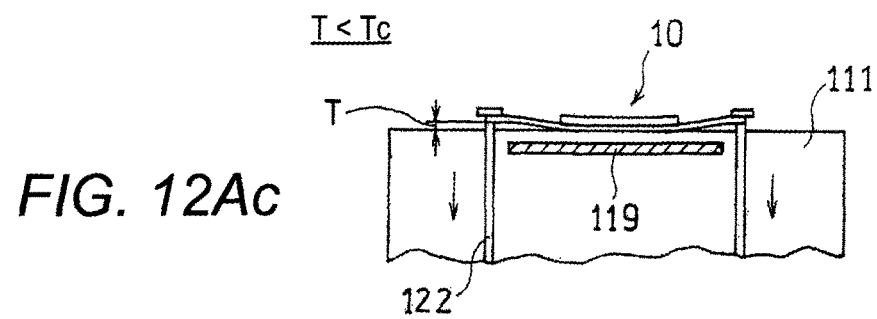
Figure 12A:
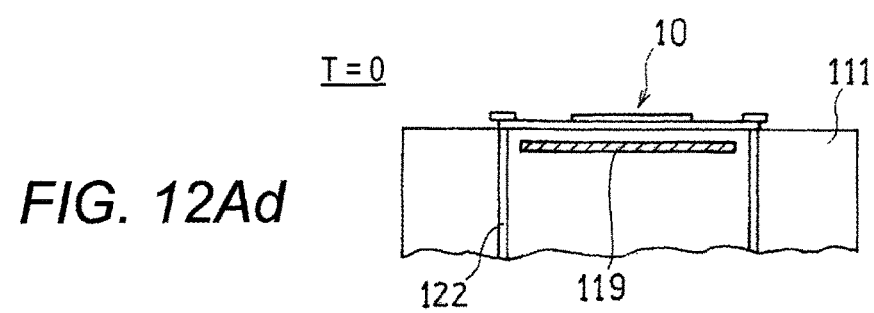
Figure 12B:
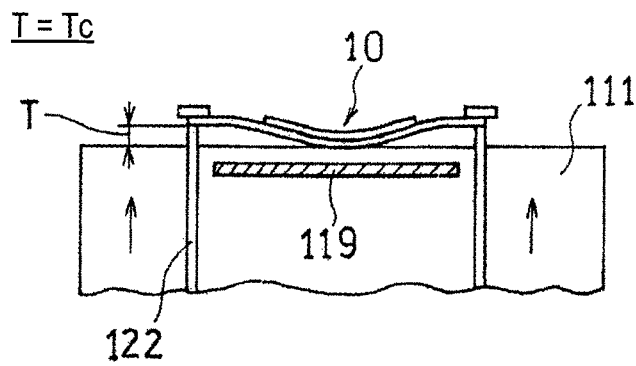
FIGS. 12Ba to 12Bd are conceptual diagrams showing an elevation/lowering operation M that is performed by the plasma processing apparatus according to the fourth embodiment.
Figure 12B:
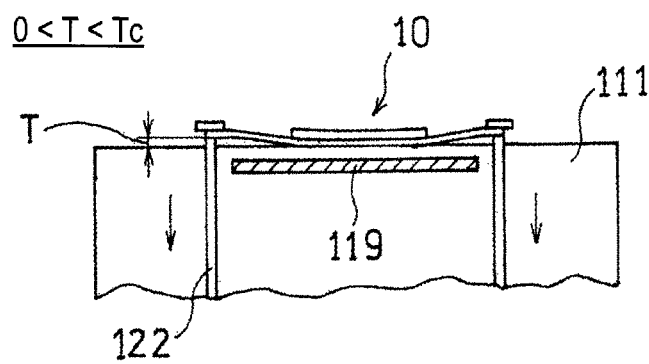
Figure 12B:
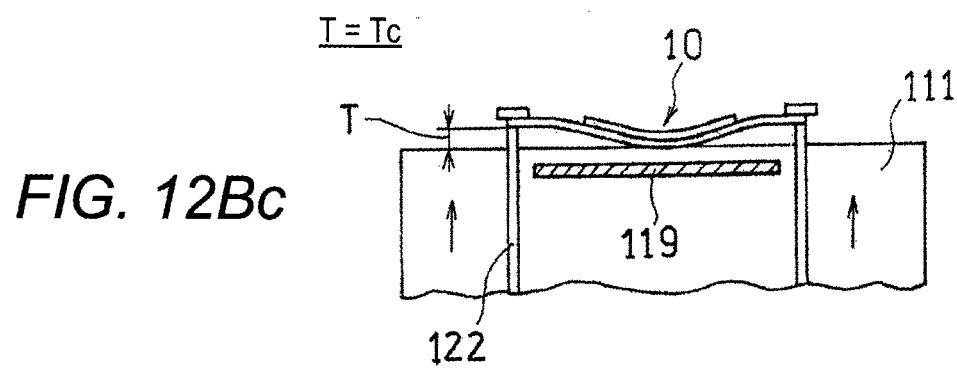
Figure 12B:
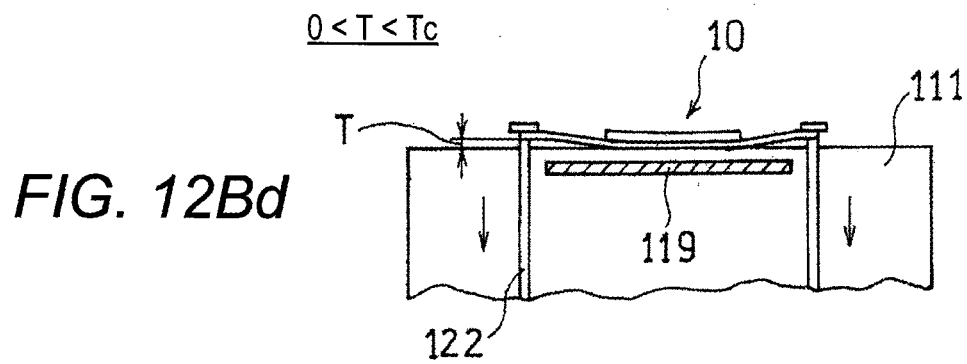

The elevation/lowering operation M will be described with reference to FIGS. 12Aa to 12Ad and FIGS. 12Ba to 12Bd. FIGS. 12Aa to 12Ad conceptually show an operation of the plasma processing apparatus from a start of lowering of the support portion 122 that supports the conveyance carrier 10 to mounting of the conveyance carrier 10 on the stage 111. FIGS. 12Ba to 12Bd conceptually show the elevation/lowering operation M. In FIGS. 12Aa to 12Ad and FIGS. 12Ba to 12Bd, the ESC electrode 119 to which a voltage is applied is shown by hatching. Also in FIGS. 12Aa to 12Ad and FIGS. 12Ba to 12Bd, warps are exaggerated for the sake of description.

As shown in FIG. 12Aa, first, the support portion 122 that supports the conveyance carrier 10 starts to be lowered. At this time, the distance T between the top surface 122a of the support portion 122 and the stage 111 is longer than the warp Tc (T>Tc). A voltage(s) is applied to the ESC electrode(s) 119 after the start of lowering of the support portion 122. The support portion 122 continues to be lowered, and as shown in FIG. 12Ab the lowest point of the warped portion of the holding sheet 3 comes into contact with the stage 111 (T=Tc) and, at the same time, the contact portion is absorbed on the stage 111. The support portion 122 still continues to be lowered and the contact portion of the holding sheet 3 is absorbed on the stage 111 immediately as shown in FIG. 12Ac, and lands on the stage 111 completely as shown in FIG. 12Ad.

The elevation/lowering operation M shown in FIGS. 12Ba to 12Bd is performed in a period from the start of landing (FIG. 12Ac) to the completion of landing (FIG. 12Ad). The elevation/lowering operation M is an operation that the support portion 122 being lowered from the transfer position toward the mounting position are stopped in the vicinity of the stage 111 and then elevated and lowered (repeatedly). In this example, an operation that the support portion 122 is elevated until the distance T becomes equal to Tc (see FIGS. 12Ba and 12Bc) and then lowered to a position that satisfies a relationship 0<T<Tc (see FIGS. 12Bb and 12Bd) is performed three times. The elevation/lowering operation M may include plural cycles (e.g., two or three cycles) each including elevation and lowering of the support portion 122.

Since the voltage(s) is being applied to the ESC electrode(s) 119, absorption force acts on a portion, in contact with the stage 111, of the holding sheet 3 from the stage 111. Therefore, the holding sheet 3 is absorbed on the stage 111 upon coming into contact with the stage 111. At this time, there may occur a case that the holding sheet 3 is absorbed in a state that it is wrinkled. The elevation/lowering operation M can make a portion, in contact with the stage 111, of the holding sheet 3 less prone to be wrinkled.

More specifically, the elevation/lowering operation M is an operation that after a start of landing of the holding sheet 3 on the stage 111 the support portion 122 is elevated and lowered (repeatedly). When the support portion 122 is elevated, the conveyance carrier 10 is separated from the stage 111 and the holding sheet 3 is unwrinkled temporarily. In the elevation/lowering operation M, the support portion 122 may be elevated to either such a position as to be still in contact with the stage 111 or such a position as not to be in contact with the stage 111. In the elevation/lowering operation M, the support portion 122 is lowered to such a position that at least its warped portion comes into contact with the stage 111.

When the support portion 122 is elevated, tension acts on the holding sheet 3 from the frame 2, whereby wrinkle portions and non-absorbed portions of the holding sheet 3 are stretched. When the support portion 122 is lowered thereafter, the warped portion comes into contact with the stage 111 first and, at the same time, is absorbed on the stage 111. Then the portion around the warped portion comes into contact with the stage 111 again and, at the same time, is absorbed on the stage 111. Since the wrinkle portions and non-absorbed portions of the holding sheet 3 were stretched when the support portion 122 has been elevated previously, this time the holding sheet 3 tends to conform to (i.e., adapt to) the surface of the stage 111 and hence the portions, actually in contact with the stage 111, of the holding sheet 3 are expanded. In this manner, the elevation/lowering operation M removes the wrinkles from the portion, in contact with the stage 111, of the holding sheet 3 and hence the holding sheet 3 is absorbed on the stage 111 in a state that is not wrinkled. Plasma processing is performed subsequently, whereby the substrate 1 is etched uniformly.

The elevation/lowering operation M is performed in such a manner that the top surface 122a of the support portion 122 is located near the surface of the stage 111. That is, the top surface 122a of the support portion 122 is elevated and lowered over the surface of the stage 111 in a distance range of 0.1 to 5.0 mm. It is preferable that the elevation/lowering amplitude be smaller than or equal to the warp Tc. Where the elevation/lowering operation M includes plural elevation/lowering cycles, the amplitude may be decreased as the cycle proceeds.

As shown in FIGS. 12Ba to 12Bd, the elevation/lowering operation M may be performed in a state that at least a part of the holding sheet 3 is kept in contact with the stage 111. Where the elevation/lowering operation M is performed with part of the holding sheet 3 as a supporting point, the holding sheet 3 can be unwrinkled even more easily. In this case, in the elevation/lowering operation M, the support portion 122 may be lowered so that its top surface 122a becomes in the same level as the surface of the stage 111 (T=0) or reach a position that satisfies a relationship 0<T<Tc.

How the plasma processing apparatus 100 operates will be described below in a specific manner with reference to FIGS. 13A to 13E. Also in FIGS. 13A to 13E, warps are exaggerated for the sake of description.

Figure 13A:
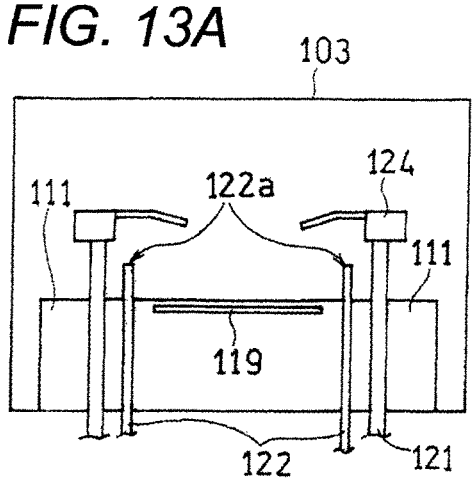
FIGS. 13A to 13E are conceptual diagrams showing an operation of the plasma processing apparatus according to the fourth embodiment.

In the vacuum chamber 103, as shown in FIG. 13A, the support portion 122 stands by at the elevated position for support of the conveyance carrier 10 and the cover 124 also stands by at the elevated position. As shown in FIG. 13B, the conveyance carrier 10 is carried into the vacuum chamber 103 by the conveying mechanism (not shown) and transferred to the support portion 122.

The conveyance carrier 10 is placed on the top surface 122a of the support portion 122 in such a manner that the surface (adherent surface 3a), holding the substrate 1, of the holding sheet 3 is located up. The frame 2 may be placed on the top surface 122a of the support portion 122 either via the outer circumferential portion 3c of the holding sheet 3 or directly. From the viewpoint of preventing the holding sheet 3 from peeling off the frame 2 when the support portion 122 is elevated or lowered, it is preferable that the conveyance carrier 10 be placed on the top surface 122a of the support portion 122 via the outer circumferential portion 3c of the holding sheet 3.

Figure 13D:
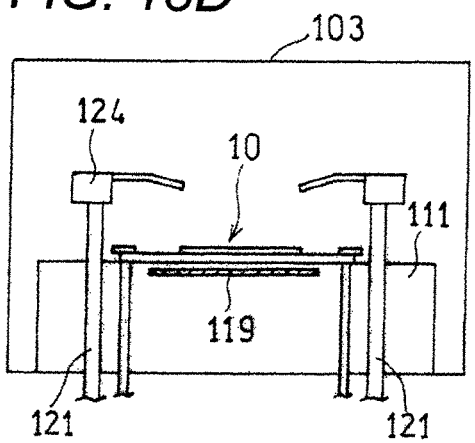
Figure 13B:
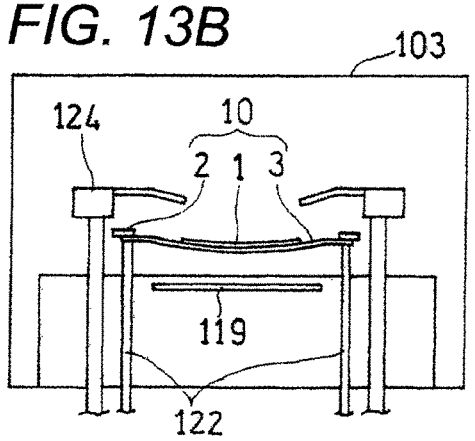
Figure 13E:
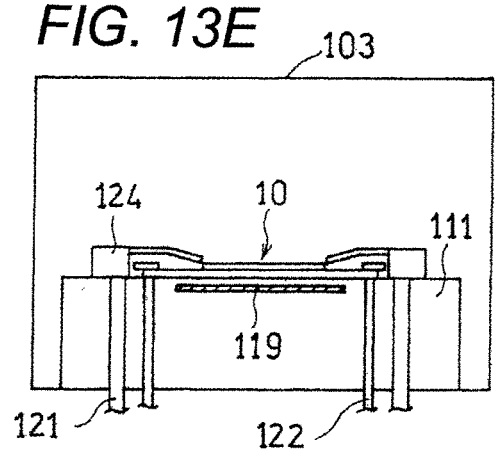
Figure 13C:
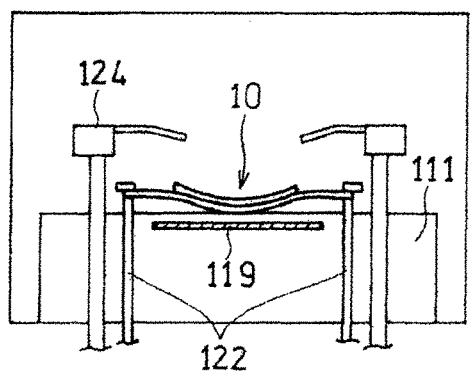

Then the support portion 122 is lowered as shown in FIG. 13C. The DC power source 126 starts applying a voltage(s) to the ESC electrode(s) 119 after the transfer of the conveyance carrier 10 to the support portion 122 before first contact of a portion of the holding sheet 3 to the stage 111.

Where the ESC electrode 119 is of the single-polarity type, plasma is generated in the vacuum chamber 103 by inputting low power (e.g., 500 W or less) to the antenna 109 from the first radio-frequency power source 110A after the placement of the conveyance carrier 10 on the top surface 122a of the support portion 122 and the exit of the conveying mechanism from the vacuum chamber 103 before application of a voltage to the ESC electrode 119. As a result, the surface of the conveyance carrier 10 is charged to establish a state that the conveyance carrier 10 can be absorbed on the stage 111 upon application of a voltage to the ESC electrode 119.

The support portion 122 is lowered further, whereby the outer circumferential portion 3c of the holding sheet 3 comes into contact with the stage 111 and the conveyance carrier 10 is mounted on the stage 111 at the prescribed position (see FIG. 13D). If the top surface 122a of the support portion 122 has been lowered to the same or lower level as or than the surface of the stage 111, it can be determined that the outer circumferential portion 3c of the holding sheet 3 is in contact with the stage 111. An elevation/lowering operation M as shown in FIGS. 12Ba to 12Bd is performed between the steps of FIGS. 13C and 13D.

After completion of the elevation/lowering operation M, the top surface 122a of the support portion 122 is lowered to the same or lower level as or than the surface of the stage 111 to complete the mounting of the conveyance carrier 10. Subsequently, the elevation rods 121 are driven by the elevation mechanism 123B and thereby lower the cover 124 to a prescribed position (see FIG. 13E). When the cover 124 has been set at the prescribed lowered position, the frame 2 and the portion of the holding sheet 3 that is not holding the substrate 1 are covered with the cover 124 without being in contact with it and the substrate 1 is exposed through the window 124W of the cover 124.

When the support portion 122 and the cover 124 have been set at the prescribed positions, process gas is introduced into the vacuum chamber 103 from the process gas source 112 via the gas inlet 103a. On the other hand, the pressure reducing mechanism 114 exhausts gas from the vacuum chamber 103 via the exhaust outlet 103b to maintain a prescribed pressure in the vacuum chamber 103.

Then plasma P is generated in the vacuum chamber 103 by inputting radio-frequency power to the antenna 109 from the first radio-frequency power source 110A. The generated plasma P is composed of ions, electrons, radicals, etc. Plasma processing on the substrate 1 is started by inputting radio-frequency power to the radio-frequency electrode 120 from the second radio-frequency power source 110B. The energy of incidence of ions on the substrate 1 can be controlled by the bias voltage that is applied from the second radio-frequency power source 110B to the radio-frequency electrode 120. The portions, exposed from the resist mask formed on the substrate 1, of the substrate 1 are removed from their top surfaces to bottom surfaces by a physico-chemical reaction to the generated plasma P, whereby the substrate 1 is divided into individual pieces. The steps from the fragmentation to carrying-out of the conveyance carrier 10 may be the same as in the first embodiment.

Fifth Embodiment

Figure 14A:
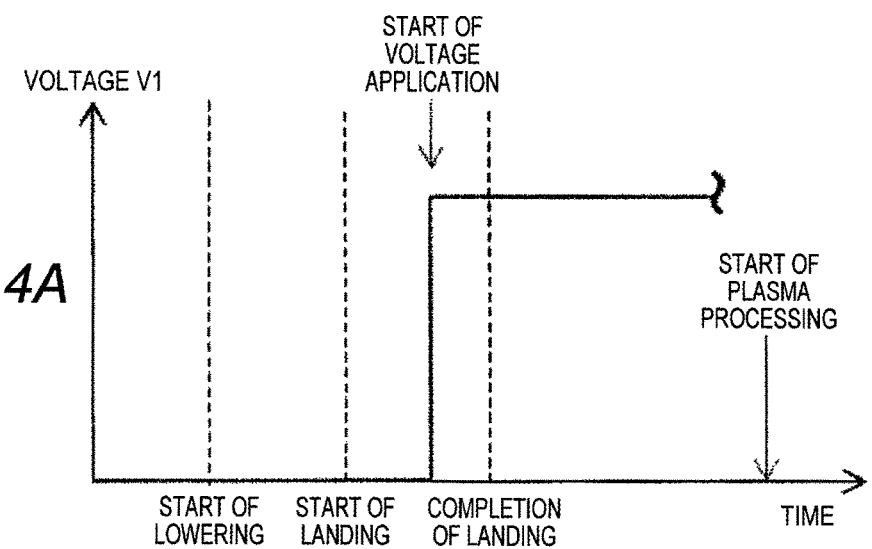
FIGS. 14A and 14B show an operation of a plasma processing apparatus according to a fifth embodiment of the invention.
Figure 14B:
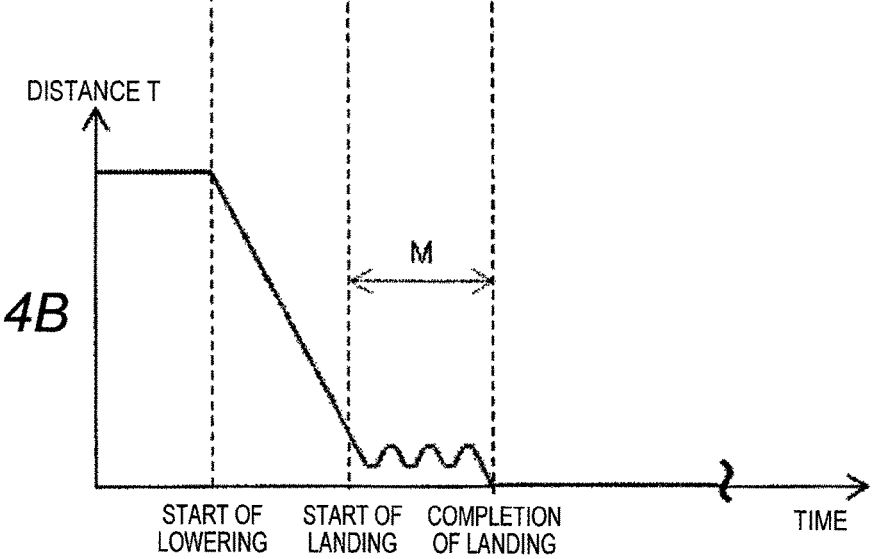

The fifth embodiment is the same as the fourth embodiment except that in this embodiment application of a voltage(s) to the ESC electrode(s) 119 is started during an elevation/lowering operation M. FIG. 14A is a conceptual graph in which the horizontal axis represents the time from a start of lowering of the support portion 122 and the vertical axis represents the voltage(s) applied to the ESC electrode(s) 119. FIG. 14B is a conceptual graph in which the horizontal axis represents the time from the start of lowering of the support portion 122 and the vertical axis represents the distance T between the top surface 122a of the support portion 122 and the stage 111.

As shown in FIGS. 14A and 14B, an elevation/lowering operation M is performed from a start of landing of the holding sheet 3 to its completion. However, the timing of execution of an elevation/lowering operation M is not limited this timing; for example, an operation is possible that the support portion 122 is elevated again after completion of landing of the holding sheet 3 and an elevation/lowering operation M is performed thereafter.

According to this embodiment, the elevation/lowering operation M allows a warped portion of the holding sheet 3 to be brought into contact with the stage 111 while being under tension. Since voltage application is started soon thereafter, a warped portion that tends to be wrinkled is absorbed on the stage 111 in a state that it is not wrinkled. Furthermore, where the elevation/lowering operation M is performed using an absorbed warped portion of the holding sheet 3 as a supporting point, the holding sheet 3 can be absorbed while the other portion is unwrinkled. Plasma processing is performed subsequently, whereby the substrate 1 is etched uniformly.

Sixth Embodiment

Figure 15A:
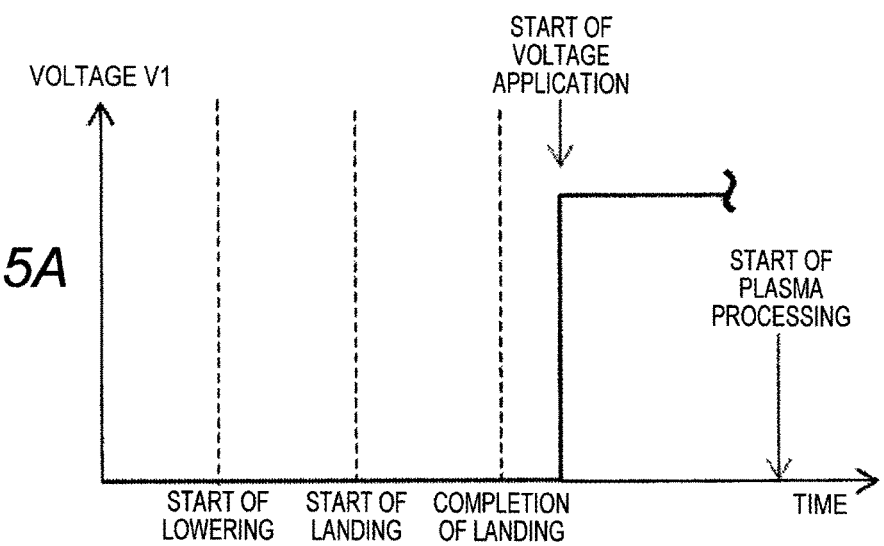
FIGS. 15A and 15B show an operation of a plasma processing apparatus according to a sixth embodiment of the invention.
Figure 15B:
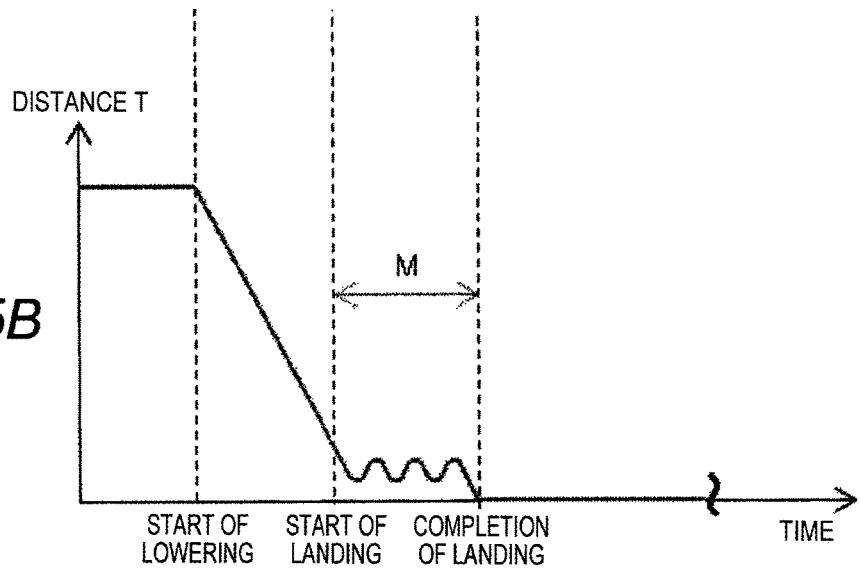

The sixth embodiment is the same as the fourth embodiment except that in this embodiment application of a voltage(s) to the ESC electrode(s) 119 is started after execution of an elevation/lowering operation M. FIG. 15A is a conceptual graph in which the horizontal axis represents the time from a start of lowering of the support portion 122 and the vertical axis represents the voltage(s) applied to the ESC electrode(s) 119. FIG. 15B is a conceptual graph in which the horizontal axis represents the time from the start of lowering of the support portion 122 and the vertical axis represents the distance T between the top surface 122a of the support portion 122 and the stage 111.

As shown in FIGS. 15A and 15B, an elevation/lowering operation M is performed from a start of landing of the holding sheet 3 to its completion. However, the timing of execution of an elevation/lowering operation M is not limited this timing; for example, an operation is possible that the support portion 122 is elevated again after completion of landing of the holding sheet 3 and an elevation/lowering operation M is performed thereafter. Since the elevation/lowering operation M causes the holding sheet 3 to be brought into contact with the stage 111 while being under tension and voltage application is started soon thereafter, the holding sheet 3 is absorbed on the stage 111 in a state it is not wrinkled.

The plasma processing apparatus according to one or more embodiments of the invention is useful as an apparatus for performing plasma processing on a substrate that is held by a conveyance carrier.

What is claimed is:

1. A plasma processing method for performing plasma processing on a substrate that is held by a conveyance carrier that is mounted on a stage of a plasma processing apparatus, the conveyance carrier comprising a holding sheet that holds the substrate and a frame that is attached to the holding sheet, said plasma processing method comprising:
   mounting the conveyance carrier on the stage;
   cooling the stage;
   applying a voltage to an electrode portion, disposed inside the stage, of an electrostatic chuck mechanism;
   increasing and decreasing an absolute value of the voltage in a double-polarity mode of an operation mode of the electrostatic chuck mechanism;
   generating plasma to electrically charge the conveyance carrier while cooling the conveyance carrier by absorbing the conveyance carrier on the stage in the double-polarity mode;
   switching the operation mode of the electrostatic chuck mechanism from the double-polarity mode to a single-polarity mode; and
   performing the plasma processing to etch the substrate while cooling the conveyance carrier by absorbing the conveyance carrier on the stage in the single-polarity mode.

2. The plasma processing method according to claim 1, wherein in the voltage varying operation, the voltage is varied in n cycles in such a pattern as to have values $V_n$, $W_n$, and $V_{n+1}$ in this order, where n is an integer that is greater than or equal to 1 and relationships $|V_n|>|W_n|$, $|W_n|\geq 0$, and $|V_n|\leq|V_{n+1}|$ hold.

3. The plasma processing method according to claim 2, wherein a relationship $|V_n|<|V_{n+1}|$ holds.

4. The plasma processing method according to claim 2, wherein the voltages $V_n$ and $V_{n+1}$ are opposite in polarity.

5. The plasma processing method according to claim 1, wherein during the plasma processing, higher radio-frequency power is input to an antenna of the plasma processing apparatus compared to a radio-frequency power input during the switching from the double-polarity mode to the single-polarity mode.

6. A plasma processing method for performing plasma processing on a substrate that is held by a conveyance carrier that is mounted on a stage of a plasma processing apparatus, the conveyance carrier comprising a holding sheet that holds the substrate and a frame that is attached to an outer circumferential portion of the holding sheet, said plasma processing method comprising:
   supporting the conveyance carrier by a support portion, which is capable of being elevated and lowered relative to the stage;
   mounting the conveyance carrier to a stage-mounted position on the stage by lowering the support portion; and
   applying a voltage to an electrode portion, disposed inside the stage, of an electrostatic chuck mechanism,
   wherein the mounting the conveyance carrier comprises elevating and lowering the support portion in at least one cycle near the stage after contact of the holding sheet to the stage, and
   wherein the plasma processing is performed after completion of the elevating and lowering the support portion and also after contact of the outer circumferential portion of the holding sheet to the stage.

7. The plasma processing method according to claim 6, wherein the elevating and lowering the support portion is executed in a state that at least a part of the holding sheet is in contact with the stage.

8. The plasma processing method according to claim 6, wherein application of the voltage to the electrode portion is started before contact of the outer circumferential portion of the holding sheet to the stage.

9. A plasma processing method for performing plasma processing on a substrate that is held by a conveyance carrier that is mounted on a stage of a plasma processing apparatus, the conveyance carrier comprising a holding sheet that holds the substrate and a frame that is attached to the holding sheet, said plasma processing method comprising:
   mounting the conveyance carrier on the stage;
   cooling the stage;

applying a voltage to an electrode portion, disposed inside the stage, of an electrostatic chuck mechanism to absorb the conveyance carrier on the stage in a double-polarity mode of an operation mode of the electrostatic chuck mechanism, for cooling the conveyance carrier;

generating plasma to electrically charge the conveyance carrier while cooling the conveyance carrier;

switching the operation mode of the electrostatic chuck mechanism from the double-polarity mode to a single-polarity mode while cooling the conveyance carrier; and performing the plasma processing to etch the substrate while cooling the conveyance carrier.

10. The plasma processing method according to claim 9, wherein during the plasma processing, higher radio-frequency power is input to an antenna of the plasma processing apparatus compared to a radio-frequency power input during the switching from the double-polarity mode to the single-polarity mode.

11. The plasma processing method according to claim 9, wherein the switching from the double-polarity mode to the single-polarity mode is made while generating a low-power plasma which is generated by inputting a low power of 500 W or less to an antenna of the plasma processing apparatus.

12. The plasma processing method according to claim 9, wherein the stage is cooled by circulating a coolant whose temperature is between −20 and 20 degrees Celsius.

13. The plasma processing method according to claim 9, wherein the temperature of the conveyance carrier is lower than or equal to 100 degrees Celsius during the plasma processing.

* * * * *